United States Patent [19]
Tanimoto

[11] Patent Number: 5,079,515
[45] Date of Patent: Jan. 7, 1992

[54] LINEARIZED DIFFERENTIAL AMPLIFIER

[75] Inventor: Hiroshi Tanimoto, Kanagawa, Japan

[73] Assignee: Kabushiki Kaisha Toshiba, Kawasaki, Japan

[21] Appl. No.: 531,798

[22] Filed: May 31, 1990

[30] Foreign Application Priority Data

May 31, 1989 [JP] Japan ................................ 1-135809
Sep. 12, 1989 [JP] Japan ................................ 1-234615

[51] Int. Cl.$^5$ ............................................. H03F 3/45
[52] U.S. Cl. ................................... 330/256; 330/261; 330/295
[58] Field of Search ............... 330/252, 256, 261, 295, 330/149

[56] References Cited

U.S. PATENT DOCUMENTS 4,516,081  5/1985  Katakura ............................ 330/254
4,723,110  2/1988  Voorman ............................ 330/252
4,794,348  12/1988 McGinn ............................. 330/252

FOREIGN PATENT DOCUMENTS 312016   4/1989  European Pat. Off. ............ 330/252
3027071  2/1982  Fed. Rep. of Germany .

OTHER PUBLICATIONS

James C. Schmoock, "An Input Stage Transconductance Reduction Technique for High-Slew Rate Operational Amplifiers", IEEE Journal of Solid-State Circuits, vol. SC-10, No. 6, Dec. 1975, pp. 407-411.

Primary Examiner—James B. Mullins
Attorney, Agent, or Firm—Foley & Lardner

[57] ABSTRACT

Disclosed is a linearized differential amplifier, comprising connecting input terminals and output terminals of the differential pairs respectively in parallel; arranging N sets of differential pairs (where N is an integer of at least 3); an offset voltage generating circuit for supplying different and equivalent offset voltages to the respective differential pairs; a circuit for weighting these output currents; and a circuit for adding the output currents. Particularly, the offset voltage generating circuit and the weighting circuit carry out equivalent weighting of the offset voltages and the output currents so that the change of the differential output current corresponding to the change of the differential input voltage shows an equal ripple characteristic. Moreover, to give equivalent offset voltages to the respective differential pairs, a linearized differential amplifier where emitter areas in respective differential pairs are different is disclosed. In this case, the ratio of emitter areas is 1:7.872983 and 1:1 when N is 3, and 1:13.40261 and 1:2.030215 when N is 4.

32 Claims, 30 Drawing Sheets

F I G. 12
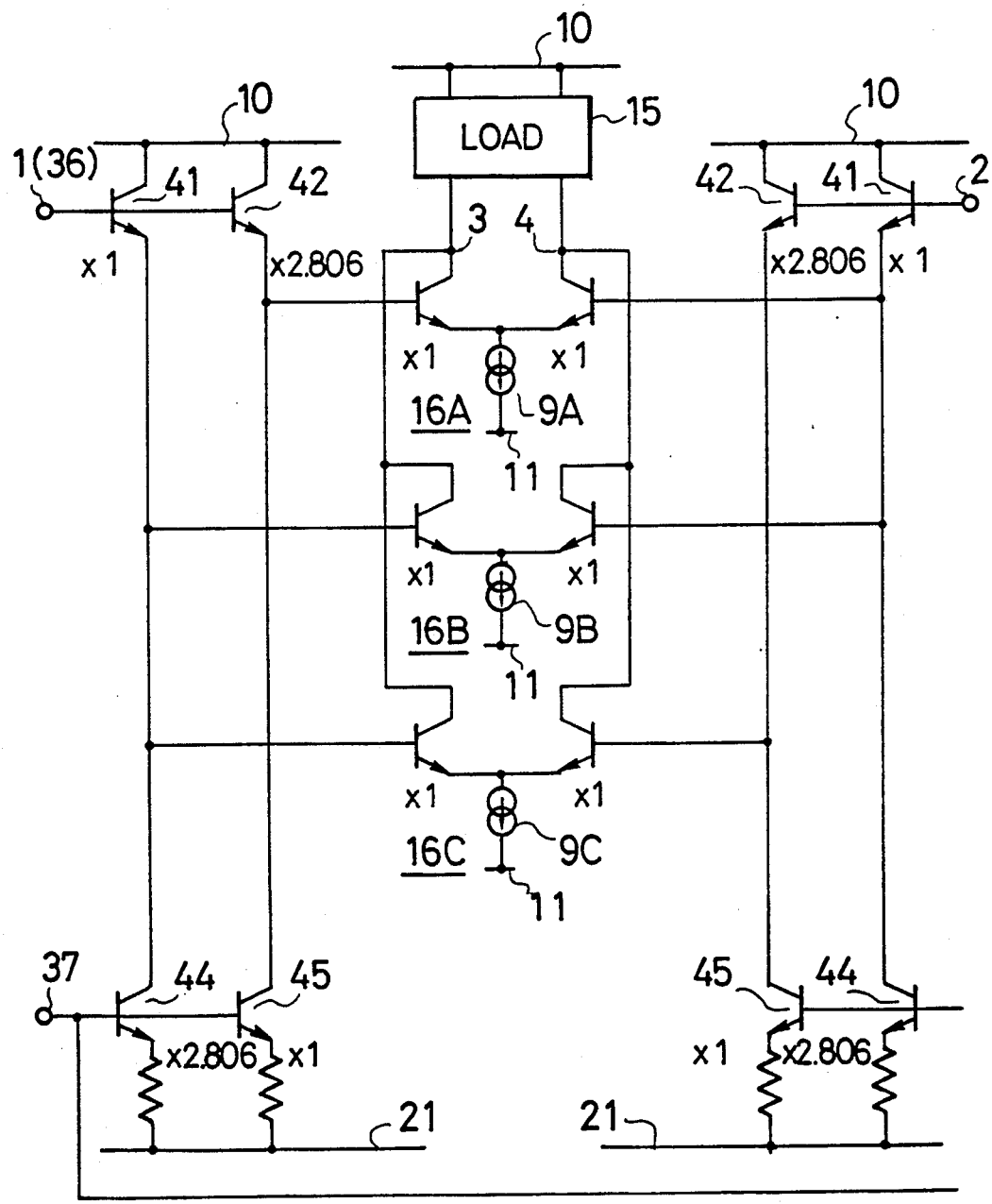

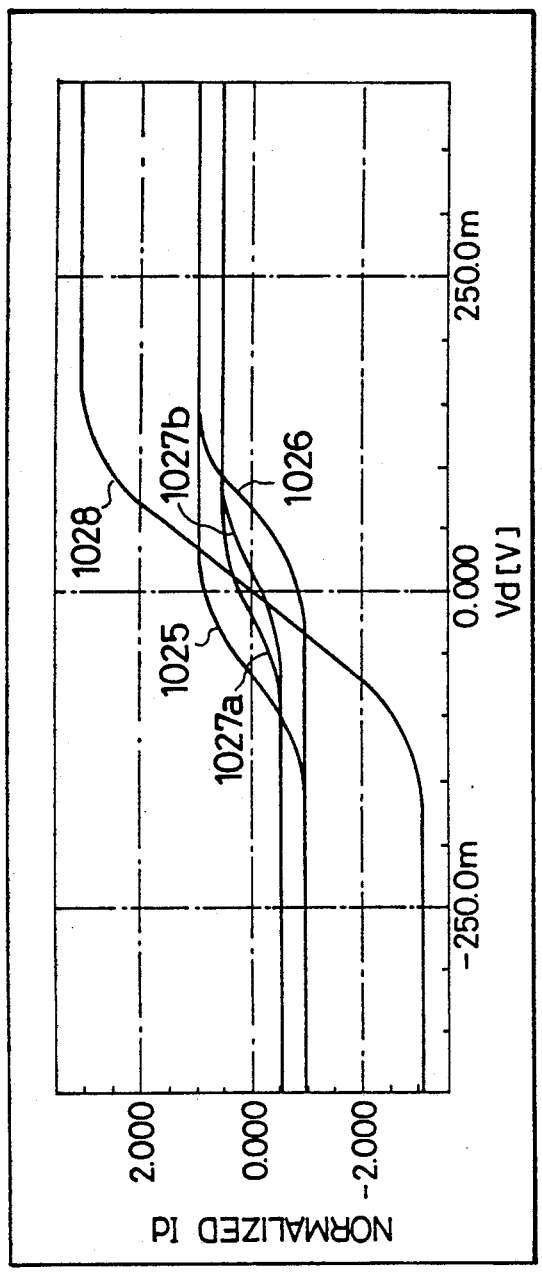
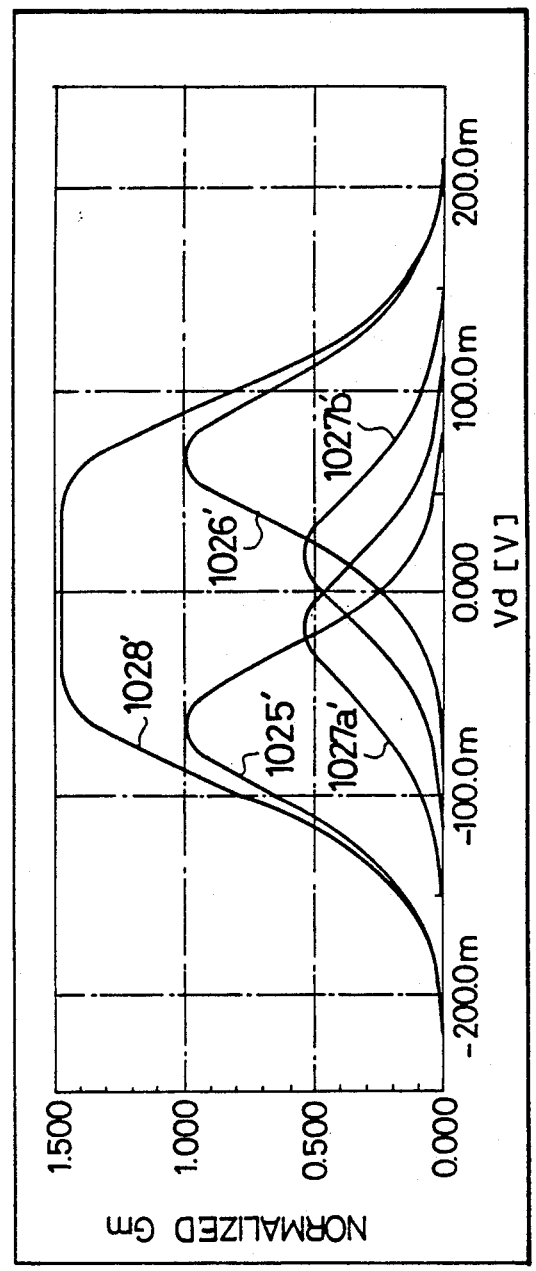
FIG. 15A
FIG. 15B

LINEARIZED DIFFERENTIAL AMPLIFIER

BACKGROUND OF THE INVENTION

1. Field of the Invention

The present invention relates to a linearized differential amplifier which can provide a constant transconductance in a wide range.

2. Description of the Prior Art

Emitter coupled pairs which are compositional elements of differential amplifiers are widely used as a basic building block for amplifiers such as an amplifier for an initial stage of an operation amplifier.

FIG. 1 is a diagram to explain an ordinary emitter coupled pair, i.e., a differential pair. In the same diagram, reference numerals 1 and 2 show input terminals, 3 and 4 show output terminals and 5 and 6 denote a first and a second bipolar transistor respectively composing the differential pair. Moreover, 7 and 8 respectively designate dc (direct current) power sources for supplying a first and a second offset voltage, 9 shows a dc current source for determining an operation current for the differential pair, 10 shows a positive power source line, 11 shows a negative power source line, 12 and 13 show load current sources and 14 shows a load resistance. Incidentally, reference numeral 16 shows a portion as the whole differential pair except a load portion 15.

In FIG. 1, when a current value of the current source 9 is $I_{EE}$, a voltage value of the voltage sources 7 and 8 for giving offset voltage is zero, current values of the load current sources 12 and 13 are respectively $I_{EE}/2$, and an input voltage to be applied between the input terminals 1 and 2 is $V_d$, further, $\alpha_F$ is a common base forward current gain of the transistors 7 and 8, and $V_T$ designates a thermal voltage, a current $I_d$ flowing in the load resistance 14 is expressed by the following equation (1) as described in literature [A].

$$I_d = \alpha_F \tan h (-V_d/V_T) \quad (1)$$

Literature [A]: Paul R. Gray and Robert G. Meyer; "Analysis and Design of Analog Integrated Circuits" second edition, pp. 194-197, John Wiley & Sons, Inc., New York, 1984.

As shown in FIG. 2A, in the relation between the input voltage $V_d$ and the output current $I_d$ in the equation (1), $I_d$ changes linearly in proportion to $V_d$ when an absolute value of $V_d$ is small. However, when the absolute value of $V_d$ becomes large, $I_d$ becomes far from the linear change and approaches $\pm I_{EE}$ gradually.

To see the linear range, it is convenient to investigate a curve of transconductance $G_m$ obtained by differentiating $I_d$ by $V_d$, that is, expressed by the following equation (2).

$$G_m(V_d) = (\alpha_F I_{EE})/2 V_T [1 - \tan h^2 (-V_d/2 V_T)] \quad (2)$$

The curve of $G_m$ is in the shape of a symmetrical bell as shown in FIG. 2B.

For simplification, the following normalization (3) will be used hereinafter.

$$x = -V_d/2V_r \quad (3)$$
$$y = I_d/\alpha_F I_{EE}$$

Moreover, the equations (1) and (2) will be normalized as follows in the following explanation.

$$y = \tan h (x) \quad (4)$$

$$G_m(x) = dy/dx = 1 - \tan h^2(x) \quad (5)$$

Generally, an operational amplifier is used with negative feedback and has a large gain in the second stage or stages thereafter, thus imaginary short is established between the inverted and non-inverted input terminals of the differential pair which composes the first stage. As the result, a potential difference applied between the input terminals becomes very small, for example, about several millivolts. Accordingly, the linearity of the differential pair is hardly impaired in this case.

While, differential pairs are used for filters, multipliers, oscillators and the like because the transconductance $G_m$ can be changed in proportion to the operational current. In such cases, it is ordinarily desired that a voltage applied between the input terminals of the differential pair be large within the range of the linear operation because of the S/N ratio and the like. Thus, a wider linear operational range is required in order to handle an input signal of a greater level.

However, as shown in FIG. 2B, in the conventional differential pair, a flat portion of the curve of the transconductance Gm in the vicinity of Vd=0 is very narrow, and the range of Vd where an absolute value of Gm is reduced by 1% from the maximum value is about 10 mV at ordinary temperature.

The it is also known that there is a method called emitter degeneration for enlarging the linear area by connecting between emitters of differential pairs through resistance to apply a local negative feedback rather than connecting them directly. This method is simple and effective, however, noise is increased because of the resistance. Also it is difficult to change the transconductance because of the negative feedback. Thus, there are occasional drawbacks when applying this method to filters and the like.

Moreover, there is a method using a differential amplifier of a Gilbert gain cell type as a means for changing a transconductance Gm by using the emitter degeneration. Since the gain cell itself is described in detail in pp. 590-600 of the literature [A] or in the following literature, the detailed explanation is not given here.

LITERATURE: "BIPOLAR AND MOS ANALOG INTEGRATED CIRCUIT DESIGN", ALAN B. GREBENE, John Wiley & Sons, New York, 1984, pp. 437-443.

In short, a first differential pair has an emitter degeneration resistance, and a transistor whose base and collector are shorted is provided as the load, and the potential difference between both the terminals is inputted to a second differential pair not having the emitter degeneration resistance. As the result, by changing a current of the common emitter of the second differential pair, the transconductance from the base input terminal of the first differential pair to the collector output terminal of the second differential pair can be changed.

Moreover, the differential amplifier using the gain cell can easily realize a linear input range of 1 volt. As an example of composing a filter using such a linearized differential amplifier, there is "Multiple purpose filter" disclosed in Japanese Patent Application for Disclosure No. 58-161413.

However, according to the method, since compression and expansion of the signal voltage are carried out to cancel the exponential characteristics of the transistor, the S/N ratio is more deteriorated than that of a simple differential pair even through the linear range can be enlarged.

To solve the problem, there is a proposition for linearizing the differential pair without using the emitter degeneration discussed in literature [B].

Literature [B]: James C. Schmoock; "An Input Transconductance Reduction Technique for High-Slew Rate Operational Amplifiers", IEEE Journal of Solid-State Circuit, SC-10, no. 6, pp. 407–411, December 1975.

This proposition mainly refers to a method of reducing the transconductance by using two differential pairs whose emitter areas are asymmetrical to the fact each other, and also refers to that the linear operation range becomes the widest when the ratio of the emitter areas is about 1:4.

However, according to the method, though the linear range can be enlarged about four times as compared with that of the conventional simple differential pair, it is still insufficient. Since the input terminal is directly the base of the transistor, the input impedance is relatively large.

Moreover, in order to obtain a wide linear operation range, there is a proposition to linearize the differential pair without using the emitter degeneration in "Transconductance amplifier" of Japanese Patent Application for Disclosure No. 62-200808. The method can provide an extremely wide linear range substantially equal to that of the linearized differential amplifier with the gain cell, and can guarantee a preferable S/N ratio.

The principle of the method is, in short, to operate the differential pair in class "AB" operation. It is, therefore necessary to give an operational current corresponding to the input voltage. To realize this operation, the input voltage is divided by resistances and given to bases of a plurality of transistors. However, since these resistances are inserted in series to the bases, it is unpreferable to set them at relatively large values in view of noise and frequency characteristics. Accordingly, to utilize the feature of the circuit, it is necessary that the input resistances be relatively low.

The restriction is not preferable for the circuit design. For example, since an integrator is composed by connecting a capacitor to the output terminal of the transconductance amplifier, a filter can be composed of mutual connections of a plurality of the integrators.

In such a configuration, since an input terminal of one integrator is connected to an output terminal of another integrator, a low input resistance of one integrator is loaded on the output terminal of another integrator, so that the Q value (Quality factor) of the filter is makedly lowered.

As stated above, the following problems still remain in the conventional differential pair or circuit.

(1) A differential amplifier whose linear operation range is wide and transconductance is changeable is required for filters, multipliers and oscillators. However, though the conventional differential circuit of the gain cell type using the emitter degeneration has a wide linear operation range, the S/N ratio thereof is inferior.

(2) While, the class "AB" operation circuit not using the emitter degeneration has a wide linear range and a preferable S/N ratio, the input impedance is low.

SUMMARY OF THE INVENTION

Therefore, it is an object of the present invention to provide a linearized differential amplifier which has a wide linear operation range and a high input impedance.

To achieve the object, a linearized differential amplifier according to the present invention is characterized by a differential amplifier composed of parallel connections of input terminals and output terminals of differential pairs using bipolar transistors, which comprises arranging N sets of the differential pairs where N is an integer of at least 3, means for giving an offset voltage equivalent to each the differential pair, means for weighting these output currents, and means for adding these output currents.

When an offset voltage is given to a differential pair, absolute value of the transconductance in the differential pair gives maximum value corresponding to an input voltage equals to the offset voltage.

The transconductance value is symmetrical with respect to the input voltage set at the offset voltage, and monotonously decreases as the input voltage becomes larger or smaller than the offset voltage.

The state can be seen by calculation on supposition that $V_d$ is a sum of the offset voltage $V_{os}$ and Vd in the equation (2), and the curve is obtained by shifting the graph (based on the equation (2)) shown FIG. 2B to the right by $V_{os}$.

As shown in FIG. 2B, the transconductance corresponding to one differential pair has one peak at the input voltage, thus when voltages defined by sums of an identical input voltage and suitable offset voltages are respectively given to N sets of differential pairs, N sets of peaks of transconductances can be obtained.

For example, by adding output currents of three differential pairs and weighting them respectively, one peak having a relatively flat top portion can be synthesized from three peaks having different heights thereby enlarge the linear operation range. In this case, the enlarged range is about 2.9 times that of the simple differential pair, thus the linear input range is sufficiently practical.

Namely, by adding output currents of N sets of differential pairs and weighting them respectively, one peak having a flat top portion can be synthesized from N peaks having different heights so that the linear operation range can be enlarged. In this case, since the number of the differential pairs, i.e., N is 3 or more, the degree of enlargement is 9 times or more as compared with the simple differential pair, thus the differential amplifier according to the present invention is sufficiently practical.

As stated above, the linearized differential amplifier of the present invention has a wide linear operation range and can guarantee a high input impedance.

These and other objects, features and advantages of the present invention will be more apparent from the following description of a preferred embodiment taken in conjunction with the accompanying drawings.

BRIEF DESCRIPTION OF THE DRAWINGS

FIG. 12 is a circuit diagram of a differential amplifier in which the offset voltage generating circuit shown in FIG. 10B is used, FIGS. 15A and 15B are diagrams to respectively show relations of the differential output current to the differential input voltage for each the differential pairs shown in FIG. 14.

DETAILED DESCRIPTION OF THE EMBODIMENT

Hereinafter, an embodiment of a linearized differential amplifier of the present invention will be described.

Figure 2A:
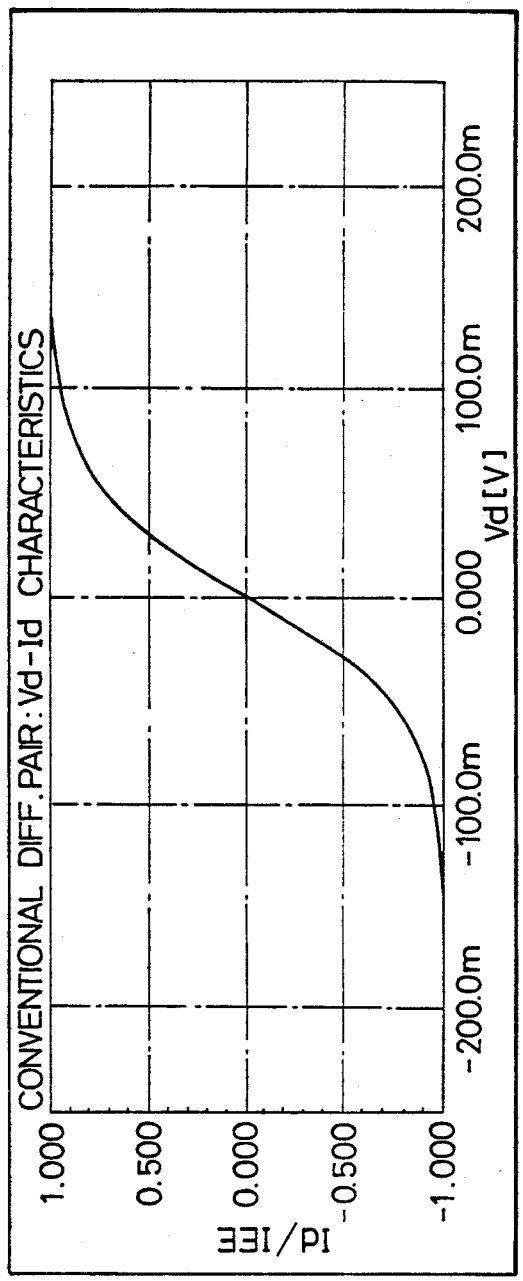
FIGS. 2A and 2B are explanatory diagrams to show operation of the differential pair shown in FIG. 1.
Figure 2B:
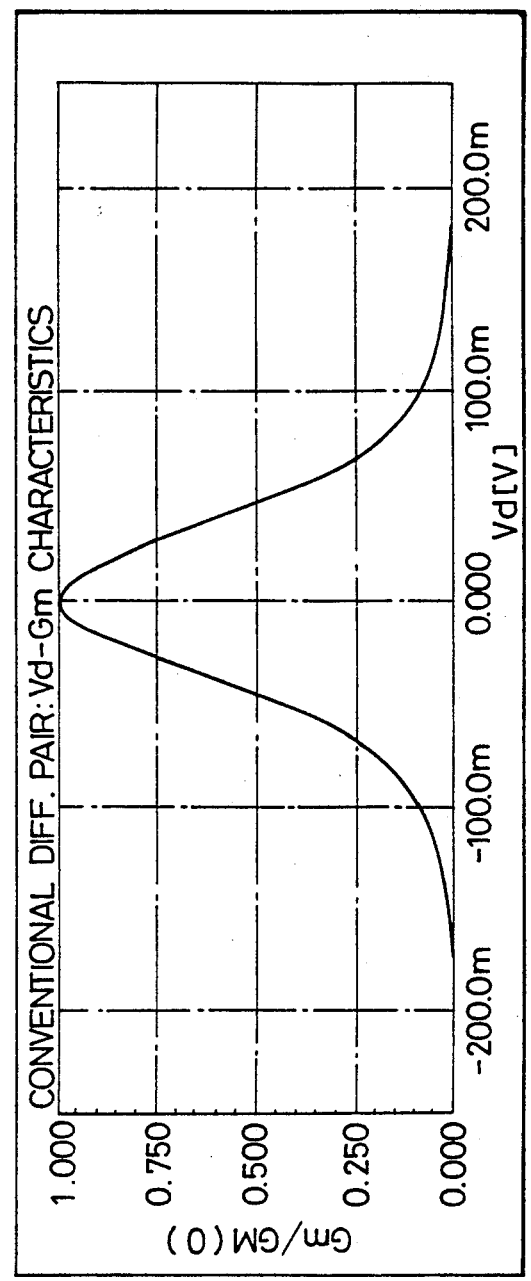
Figure 3:
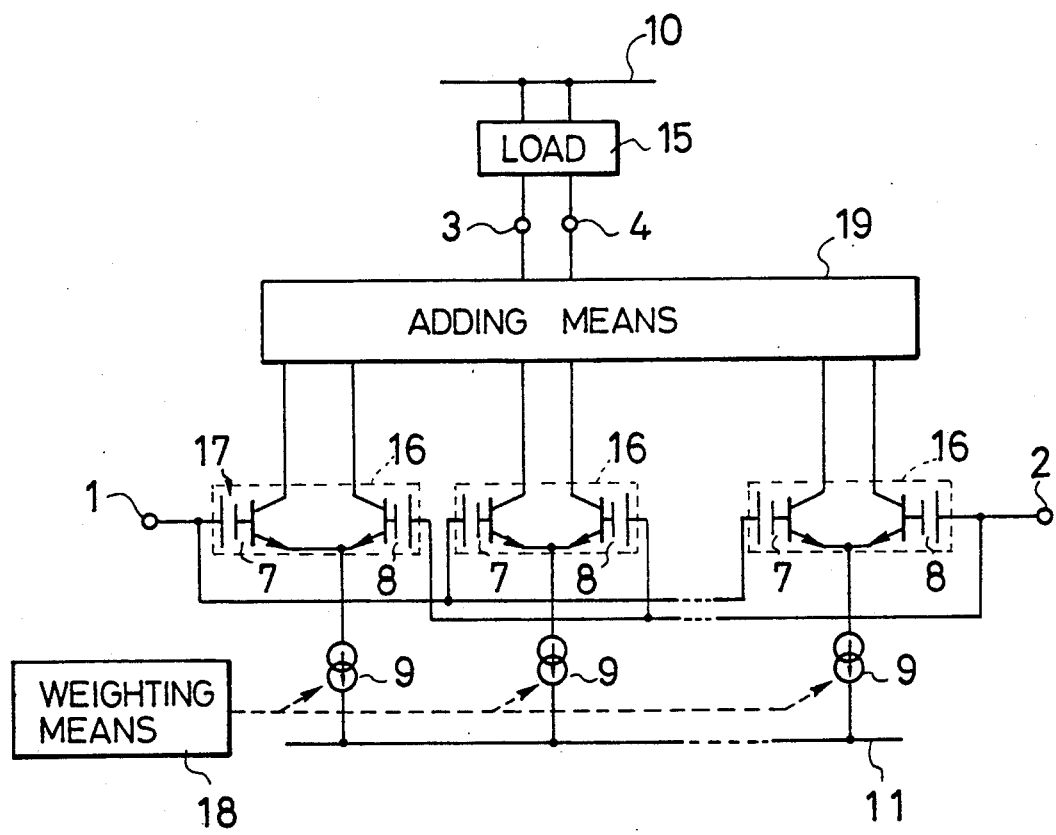
FIG. 3 is a circuit diagram to show the schematic composition of a linearized differential amplifier of the present invention.

The linearization in the linearized differential amplifier of the present invention basically comprises using a linearized differential amplifier schematically shown in FIG. 3, preparing a plurality (N pairs) of the differential amplifiers so as to have offsets in the positive and negative directions to the transconductance $G_m$ of the differential amplifier shown in FIG. 2B, and adding them with weighting.

Figure 1:
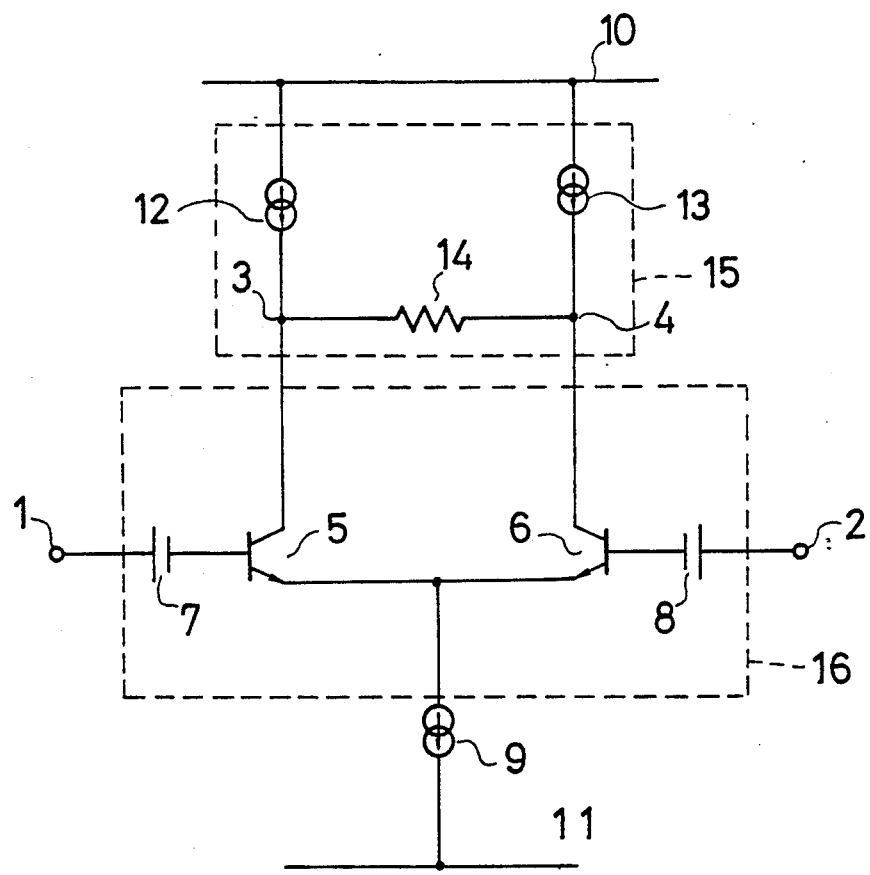
FIG. 1 is a circuit diagram of a general differential pair which is ordinarily used.

Namely, in the linearized differential amplifier shown in FIG. 3, N pairs (where N is an integer of 3 or more) of differential pairs 16 shown in FIG. 1 are provided in parallel. Moreover, to each the pair 16 are provided offset voltage supplying means 17 (7, 8), weighting means 18 for weighting each output current, and adding means 19 through which a load 15 is arranged. The weighting means 18 can be arranged on the collector side of each the differential pair 16, but it can also be arranged on the emitter side. Incidentally, as the adding means 19, an ordinary electrical adding circuit can be used, but when the output current of each the differential pairs to be added is supplied at a high impedance, it is advantageous that the circuit can be realized by a wired or circuit very simple construction comprising, e.g., a direct connection of each wire.

Figure 4A:
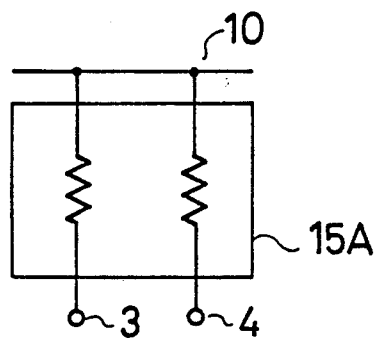
FIGS. 4A, 4B and 4C are circuit diagrams to respectively show examples of load circuits to be used in the present invention.
Figure 4B:
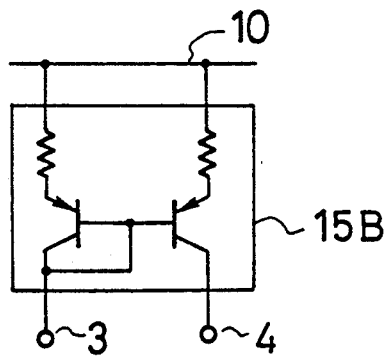
Figure 4C:
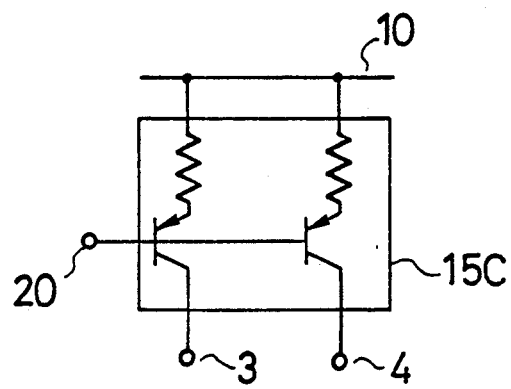

FIGS. 4A, 4B and 4C show examples of the load circuit. Specifically, FIG. 4A shows an example of a resistance load 15A, FIG. 4B shows an example of a current mirror load 15B, and FIG. 4C shows an example of a load 15C having a current source with a bias voltage terminal 20.

As seen from FIG. 2B which was referred to on explanation of the conventional example, since the curve of the transconductance Gm is symmetrical with respect to the Y-axis, it is necessary that the positive and negative offsets be also given symmetrically with respect to the Y-axis in order to make the linear operation range as wide as possible. Similarly, it is necessary that the weighting of each the differential pair 16 to Gm be given symmetrically with respect to the Y-axis.

Accordingly, when an odd number of differential pairs are used, for example, N is 3, 5, or 7, only one of the differential pairs is provided with no offset voltage.

The others are arranged in groups of two differential pairs each. Each differential pair of a two pair group is then provided with offsets of equal magnitude, but opposite polarity. The offset magnitudes of each two pair group are then adjusted independently so as to linearize the total transconductance amplitude.

Incidentally, when the number of the differential pairs is even, for example N is 4, 6, or 8, they are arranged in groups of two differential pairs. Each differential pair of a two pair group is then provided with offsets of equal magnitude, but opposite polarity. The offset magnitudes of each two pair group are then adjusted independently so as to linearized the total transconductance amplitude the same as the odd number case stated above.

When G is a transconductance to be finally obtained, $\alpha_k$, $\beta$ are weighting factors to Gm, $d_k$ is the k-th offset value (k is an integer of 1 or more), N is the number of differential pairs, and [N/2] is a symbol expressing an integer part of N/2, the following equation (6) can be established:

$$G(x) = \sum_{k=1}^{[N/2]} \alpha_K \{Gm(x - d_k) + Gm(x + d_K)\} + \beta Gm(x) \quad (6)$$

The term including the symbol $\Sigma$ shows the summation with respect to k for expressing a part comprising each combination of two of the even number of differential pairs. While, the term including $\beta$ shows a part to which is not given the offset when an odd number of differential pairs are used. Namely, when the linearization is carried out by using an even number of differential pairs, $\beta$ is 0, while when it is carried out by using an odd number of differential pairs, $\beta$ is not 0. For example, when the linearization is conducted by using four differential pairs, since 4 is the product of 2 and 2, k to be used in this case is 1 and 2, and $\beta$ is 0 because 4 is an even number.

As a result, the following equation (7) is obtained:

$$G(x) = \alpha_1\{Gm(x-d_1)+Gm(x+d_1)\} + \alpha_2\{Gm(x-d_2)+Gm(x+d_2)\} \quad (7)$$

With respect to the linearization, it is preferred that the transconductance Gm which is the first order derivative of the current be so set as to have a constant value in a range of x as wide as possible. For this purpose, it is necessary that values of the derivatives of G in the respective orders be set at 0 or a value near to 0. As a method which is used as a functional approximation method for approximating a constant value, there are the maximally flat approximation and the equal ripple approximation.

The maximally flat approximation is an approximation method for setting the derivatives of G at x=0 at 0 up to an order as high as possible. Moreover, it is called the maximally flat characteristics of the n-th order that the derivatives up to the n-th order are 0.

In the equal ripple approximation, it is attempted to realize a part of the transconductance, where it is constant within a predetermined allowable range.

For the following explanation, calculation results of the derivatives of Gm are shown, where the derivative of Gm of the n-th order is expressed by $Gm^{(n)}$.

$$Gm^{(0)} = dy/dx = 1 - \tanh^2(x) \quad (8)$$
$$= Gm$$

$$Gm^{(1)} = 2\tanh^3(x) - 2\tanh(x) \quad (9)$$

$$Gm^{(2)} = -6\tanh^4(x) + 8\tanh^2(x) - 2 \quad (10)$$

$$Gm^{(3)} = 24\tanh^5(x) - 40\tanh^3(x) + 16\tanh(x) \quad (11)$$

$$Gm^{(4)} = -120\tanh^6(x) + 240\tanh^4(x) - 136\tanh^2(x) + 16 \quad (12)$$

Hereinafter, composition and operation of a linearized differential amplifier having three sets of differential pairs will be described as a first embodiment of the present invention.

Figure 5:
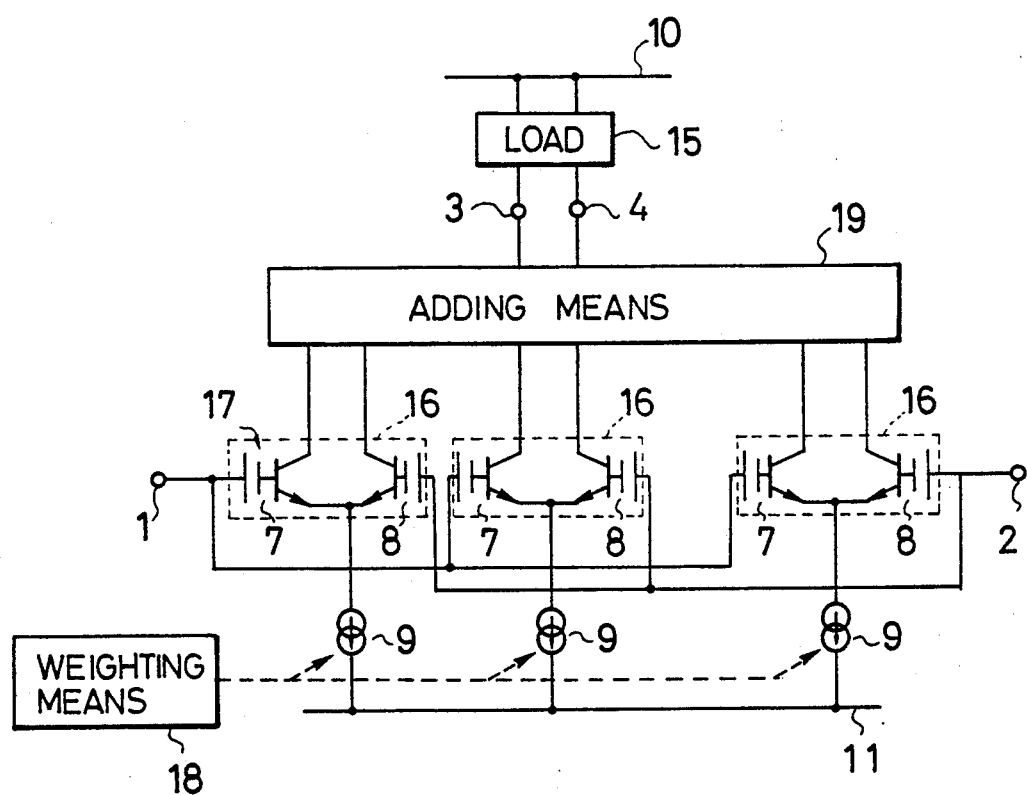
FIG. 5 is a circuit diagram of a linearized differential amplifier (comprising three differential pairs) which is a first embodiment of the present invention.
Figure 6:
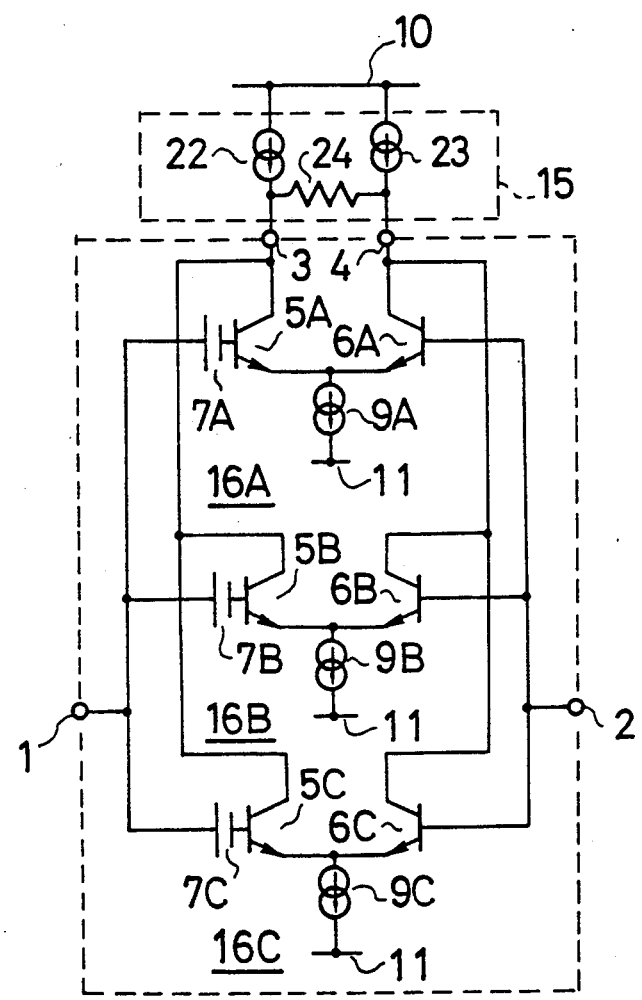
FIG. 6 is a circuit diagram of a differential pair in the linearized differential amplifier of the first embodiment.

FIG. 5 is a schematical diagram of a linearized differential amplifier which is a first embodiment of the present invention, and FIG. 6 is a circuit diagram of differential pairs in the linearized differential amplifier shown in FIG. 5. In these diagrams, reference numeral 15 shows a load, 16A, 16B, 16C show a first through third differential pair, 7A, 7B and 7C are dc voltage sources as offset voltage supply means, 9A, 9B and 9C are current sources respectively connected to common emitters of the first to the third differential pair, moreover 1 and 2 are input terminals and 3 and 4 are output terminals.

First, a method of determining specific values of the voltage sources 7A, 7B, 7C and the current sources 9A, 9B and 9C is explained.

In equation (6) of the transconductance, the parameters which can be freely selected are $\alpha_1$, $\beta_1$ and $d_1$. Since the generality of the equation (6) is not lost when $\alpha_1$ is 1, the equation (6) therefore can be changed into the following equation where $\alpha_1$ is 1 and $\beta_1$ is not 0.

$$G(x) = Gm(x-d_1) + Gm(x+d_1) + \beta Gm(x) \quad (13)$$

Since this equation is symmetrical with respect to x=0, the derivatives of G(x) of the odd orders are 0 at x=0. Accordingly, in order to obtain the transconductance characteristic which is flat in a wide range, it is necessary that the parameters $\beta$, $d_1$ be so determined that the derivatives of the even orders be 0 at x=0 up to the highest possible order.

Therefore, $\beta$ and $d_1$ are so obtained as to make G''(0) zero in the equation (13). The sign of prime (') is used to denote differentiation with respect to x.

First, the condition for making the differential coefficient of the second order zero is investigated.

$$G''(0) = 2(-6X^2 + 8X - 2 - \beta) \quad (14)$$

where $X = \tanh^2(d_1)$. $\quad (15)$

When the quadratic equation (14) is solved with respect to X based on the formula of root, the following equation:

$$X = [4/3 \pm \sqrt{16/9 - (4/3 + 2\beta/3)}]/2 \quad (16)$$

can be obtained. However, from the condition expressed by the equation (15), since X must be a real number and a value between 0 and 1, a range of $\beta$ is expressed by the following equation:

$$-2 \leq \beta \leq 1. \tag{17}$$

Accordingly, $d_1$ is determined by the following equation (18) with respect to X obtained by the equation (16) corresponding to $\beta$ which satisfies the equation (17).

$$d_1 = \tan h^{-1} X \tag{18}$$

Thus, since the condition $G''(0)=0$ can be guaranteed with respect to innumerable $\beta$ in the range designated by the equation (17). Next, a method of making $G''''(0)$ zero will be considered.

$$G''''(0) = -15X^3 + 30X^2 - 17X + 2 + \beta \tag{19}$$

Though the equation is a cubic equation, X and $\beta$ are in relation expressed by the equation (16) and not independent of each other, thus the value is obtained by estimating the equation (19) numerically.

As a result, the values of $\beta$ which make $G''''(0)$=zero are $-2.0000$, $+0.0000$ and $+0.64000$. Since $G(0)$ becomes 0.0000, when $\beta$ is $-2.0000$, the value of $\beta$ is not suitable because it does not serve as the factor for the amplification.

When $\beta$ is 0.0000, it is the same condition as in the prior art using two sets of differential pairs. Thus, the value is not suitable either.

Accordingly, the useful value of $\beta$ in this case is 0.6400000000.

While, values of $d_1$ corresponding to the condition (A) of $\beta$ are as follows:

$$d_1 = 1.031718534 \text{ or} \tag{B}$$

$$d_1 = 1.279489489$$

These values are respectively corresponding to $+$ and $-$ in the complex sign of $\pm$ in the equation (18). When numerical calculations are carried out based on these values, numerical values of the derivatives up to the third order are zero at $X=0$ in any case of them, but only $d_1 = 1.03171\ldots$ makes the derivative of the fourth order zero. Accordingly, $d_1 = 1.27949\ldots$ has the maximally flat characteristic of the third order, while $d_1 = 1.03171\ldots$ has the maximally flat characteristic of the fifth order. Thus the latter of $d_1$ is preferable.

As stated above, according to the first embodiment of the present invention using three sets of differential pairs, the maximally flat characteristic of the fifth order can be realized, and the conditions therefor are as follows.

$\alpha_1 = 1.000000000$
$\beta = 0.6400000000$
$d_1 = 1.031718534$

As clearly seen from the process of calculations described above, the absolute value is important with respect to $d_1$, while the ratio of 1:0.64 is important in case of $\alpha_1$ and $\beta$. When the absolute value is changed with keeping the ratio, the absolute value of the transconductance can be changed with keeping the flat range of the transconductance.

Next, an example in which the above results are applied to a real circuit will be described.

The following equations are obtained by returning the variables x and y obtained by normalization based on the equations (3) to the original variables.

$$I_d = y \cdot \alpha_F / I_{EE} \tag{20}$$

$$V_d = -x \cdot 2 V_T \tag{21}$$

Accordingly, when an offset voltage corresponding to $d_1$ is $V_{d1}$, the following equation (22) is established.

$$V_{d1} = -d_1 \cdot 2 V_T \tag{22}$$

The offset voltage $V_{d1}$ corresponding to $d_1$ is expressed by the following equation (23) based on the equation (22) at absolute temperature (T) of 300 K.

$$V_{d1} = -1.03171 \cdot 2 V_T = -53.6 \, mV \tag{23}$$

Therefore, in the circuit composition comprising connecting the input terminals and the output terminals of three sets of differential pairs respectively in parallel as shown in FIG. 6, for example, when dc voltage sources of $-53.6$ mV and $+53.6$ mV are respectively used as the means 7A and 7C for supplying offset voltages, a dc voltage source of 0 V is used as 7B, the current sources 9A, 9B, 9C respectively connected to the common emitters of the differential pairs are used as the means for weighting the output currents, and values of these currents are set about 1:0.64:1, the maximally flat characteristic of the fifth order can be realized.

In this case, the current sources 22 and 23 of the load 15 are used for determining the dc operational point in the circuit, and are set at ½ of the sum of current values of the current sources 9A, 9B, 9C.

Figures 7A, 7B:
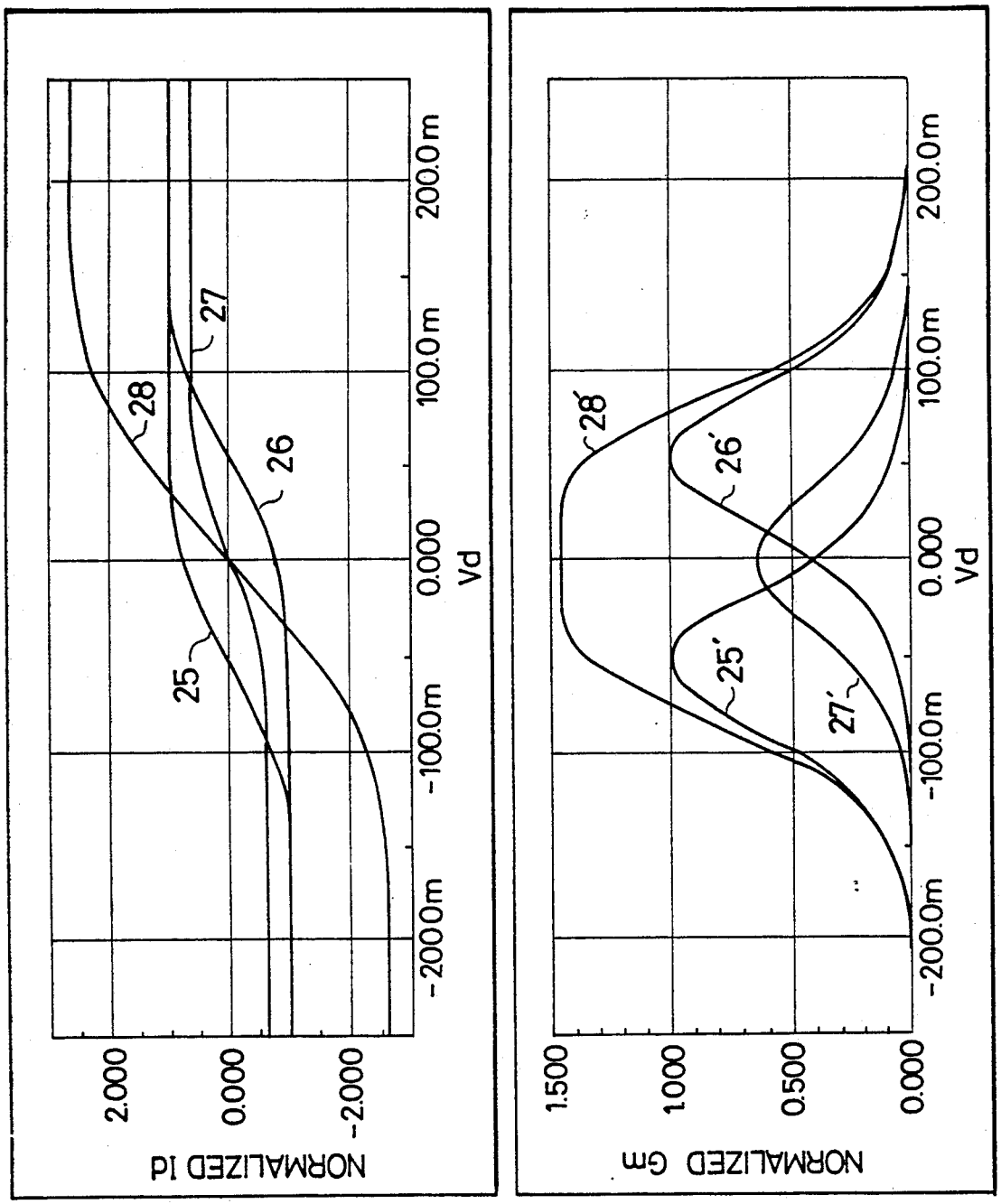
FIGS. 7A and 7B are diagrams to show relations of the differential output current to the differential input voltage for each the differential pairs shown in FIG. 6.

In order to explain operation of the circuit comprising the setting these factors as described above more intuitively, graphs 25, 27, 26 are given in FIG. 7A to respectively show dependence of the differential output currents on the differential input voltages of the differential pairs 16A, 16B, 16C of FIG. 6.

Since the output terminals of the differential pairs are respectively connected in parallel, the differential output current flowing in the load resistance 24 is the sum of these currents, thus a curve to show the output current is obtained as the sum of the curves 25, 27 and 26 in FIG. 7A, and is expressed by a curve 28 in the same drawing.

As clearly understood from the same drawing, the curve 28 has a linear range which is wider than any of 25 to 27.

To explain the fact more clearly, curves obtained by differentiation of these curves 25 to 28, i.e., curves of these transconductances are shown in FIG. 7B respectively designated by the same reference numerals with the added Prime Symbol ('). From the same drawing, it seen that the curve 28' of the transconductance of the linearized differential amplifier in the embodiment provides a wide linear operation range which is six times or more as large as that of the curve 26' obtained by the parallel shift of the transconductance of an ordinary differential pair in the direction of the lateral axis.

Figure 8:
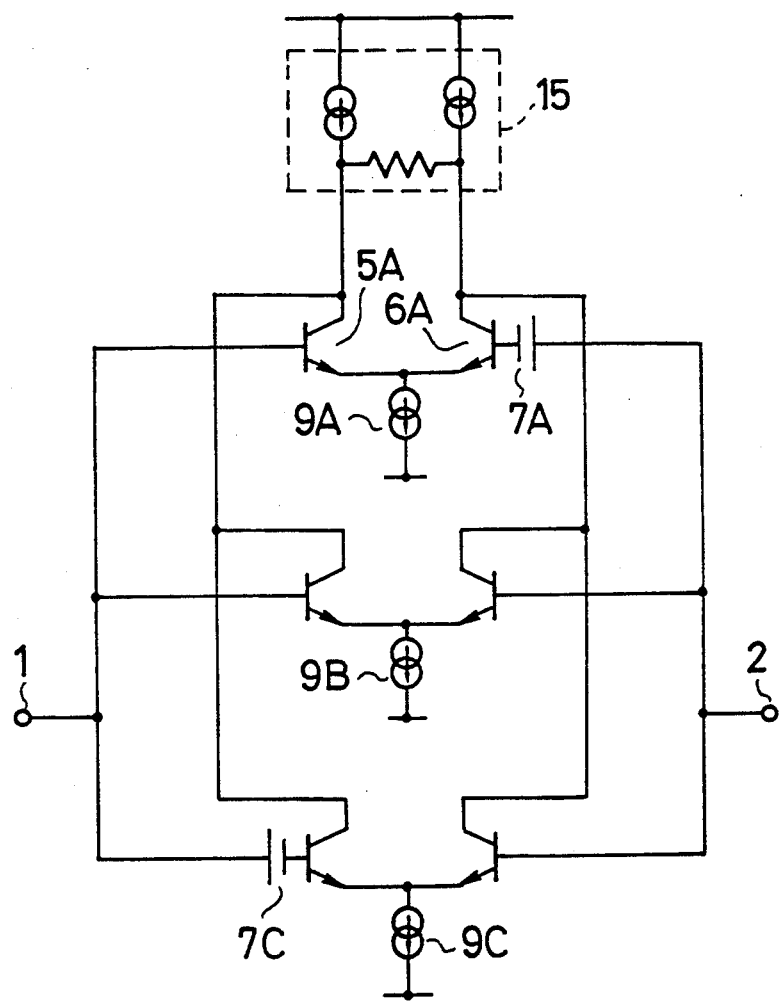
FIG. 8 is a circuit diagram to show a modified example of the linearized differential amplifier shown in FIG. 6.

In the circuit shown in FIG. 6, the offset voltage supply means 7A, 7C which have reverse polarities but an equal magnitude to each other are respectively added to transistors 5A, 5C respectively composing differential pairs 16A, 16C. However, according to the characteristics of the differential pair, for example as shown in FIG. 8, completely the same effect can be obtained by eliminating 7A and inserting a new voltage source whose voltage value is the same as 7A between the base terminal of the transistor 6A and the input terminal 2 so that the positive pole of the voltage source is on the side of the input terminal 2.

Figure 9:
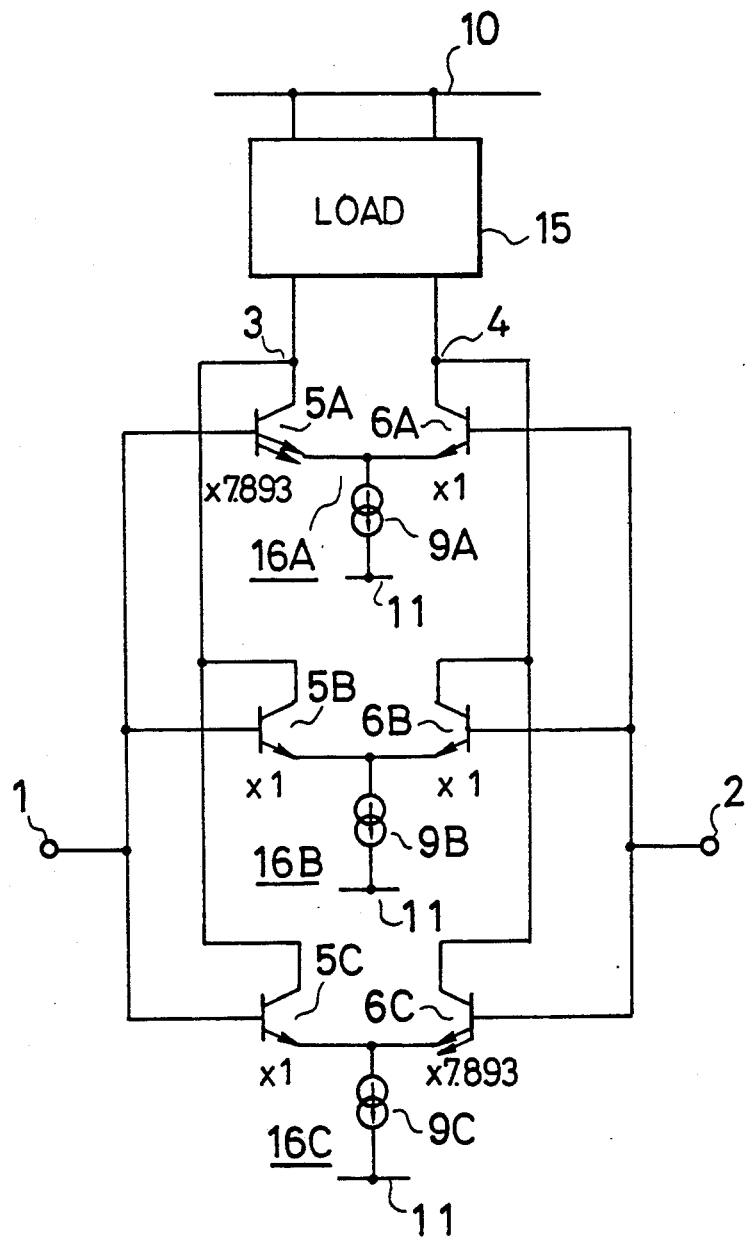
FIG. 9 is a circuit diagram of a linearized differential amplifier which is a second embodiment of the present invention.

Next, an example in which another method is used as the offset supply means will be described with reference to FIG. 9. FIG. 9 is a circuit diagram of a linearized differential amplifier which is a second embodiment of the present invention. In the same drawing, emitter areas of two transistors respectively composing differential pairs are made to be different on purpose to obtain differential pairs with offsets.

Namely, when a voltage between the base and the emitter of the transistor is Vbe and the collector current is Ic, a relation expressed by the following equation is established.

$$V_{b\theta} = V_T \log_\theta[Ic/Is] \quad (24)$$

where $V_T$ and Is are the thermal voltage and the collector reverse saturation current. Since Is is in proportion to the emitter area, when the emitter area of a transistor of one of the differential pairs is set at M times as large as that of the other, and the collector currents are identical, the voltage Vbe between the base and the emitter of the transistor is expressed by the following equation.

$$V_{b\theta} = V_T \log_\theta[Ic/MIs] \quad (25)$$

Thus, when the difference of the base and the emitter in both the transistors is $\Delta V_{b\theta}$, $\Delta V_{b\theta}$ is expressed as follows.

$$\begin{aligned}\Delta V_{b\theta} &= V_T \log_\theta[Ic/Is] - V_T\log_\theta[Ic/MIs] \quad (26)\\ &= V_T\log_\theta(M)\end{aligned}$$

Accordingly, these asymmetrical differential pairs become equivalent to symmetrical differential pairs apparently having an offset voltage of $V_T \log_\theta(M)$.

In the case of this embodiment, M is determined so that the following equation is established.

$$V_T \log_\theta(M) = d_1 \cdot 2 \ V_T \quad (27)$$

Accordingly, $$M = \exp(2d_1) = 7.872983 \quad (28)$$

Namely, the ratio of the emitter areas of the transistors composing the differential pairs is set at 1:7.872983.

The offset voltage supply means are excellent in that they do not require the temperature compensation as compared to the differential pairs shown in FIG. 6 and FIG. 8. Namely, when dc voltage sources are used as the offset voltage supply means, it is necessary that the voltage value be in proportion to $V_T$ as given by equation (22). However, in the offset voltage means utilizing the difference of the emitter areas, since $V_T$ are cancelled to each other as seen from equation (27), a suitable offset voltage can be generated automatically corresponding to any given temperature.

As stated above, FIG. 9 is a circuit diagram schematically showing a linearized differential amplifier as a second embodiment of the present invention. In the same diagram, the linearized differential amplifier is different from those in FIG. 6 and FIG. 8 in that the offset voltage supply means is not voltage source and the function is realized by the difference of the emitter areas in the differential pairs.

In FIG. 9, the offset voltage supply means is realized by setting the emitter areas of transistors 5A and 6C at about 7.873 times as large as the other transistors. Of course, since a differential pair 16B does not require the offset, a differential pair as used in the prior art is used.

Figure 10A:
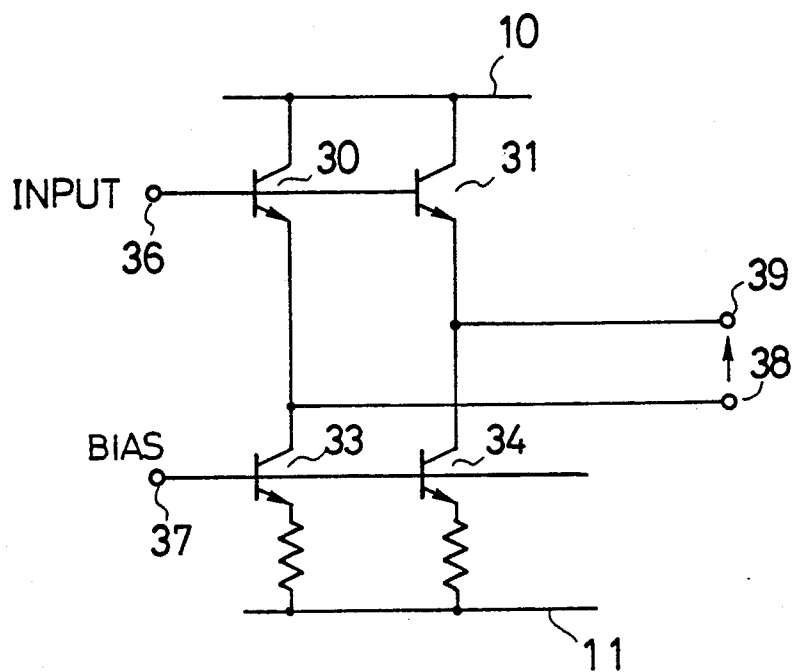
FIGS. 10A and 10B are circuit diagrams to respectively show offset voltage generating means in the linearized differential amplifier of the present invention.

Moreover, another modified example will be described. FIG. 10A is a circuit diagram for generating the offset voltage $V_{d1}$. In the same drawing, it should be noted that the offset voltage can be changed by difference of the emitter areas of transistors 30 and 31 composing the emitter follower.

Namely, desired offset can be also obtained by using the ratio of the emitter areas of the transistors 30 and 31 in place of the value of M in the equation (27). In this case, current sources respectively composed of transistors 33 and 34 are provided in the circuit to respectively flow equal currents in transistors 30 and 31. Namely, the transistors 33 and 34 have the same emitter area, and equal voltages are given to these bases through a terminal 37. Since the condition is identical to the case where equation (26) is introduced, by setting the ratio M of emitter areas of the transistors 30 and 31 at 1:7.873, a voltage which is given to the input terminal 36 generates a potential difference corresponding to the value shown by equation (22) between the output terminals 38 and 39.

By setting as described above, a potential difference of about 53.6 mV can be generated at the output terminal 39 on the basis of the output terminal 38 at absolute temperature of 300 K. thereby obtaining a similar effect to that of the circuit of FIG. 6.

Since the respective differential pairs of the differential amplifier composed by using a circuit which generates the offset voltage shown in FIG. 10A can be composed of transistors having an identical emitter area ratio, the maximally flat characteristic of the fifth order which is more excellent in the high frequency characteristic than that of the circuit shown in FIG. 9 including transistors having large emitter areas can be obtained.

Next, still another modified example will be described. As already described above, FIG. 10A shows a circuit for generating offset, the offset voltage can be changed not only by the difference of the emitter areas of the transistors 30 and 31 but also by these operational currents.

Namely, even if the ratio of the operational currents is used in place of the ratio of emitter areas of the transistors 30 and 31 as the value of M in equation (27), desired offset can be obtained. In this case, the emitter areas of the transistors 30 and 31 are set equal, and current sources respectively comprising the transistors 33 and 34 are provided so as to flow currents of a ratio of M:1 in the transistors 30 and 31 respectively. In this case, the transistors 33, 34 are respectively having emitter areas whose ratio is M:1, and an equal voltage is given to the bases through the terminal 37. Since the condition is similar to the case where equation (26) is introduced, a voltage given to the input terminal 36 generates a potential difference of the value shown by the equation (22) between the output terminals 38 and 39.

Figure 11:
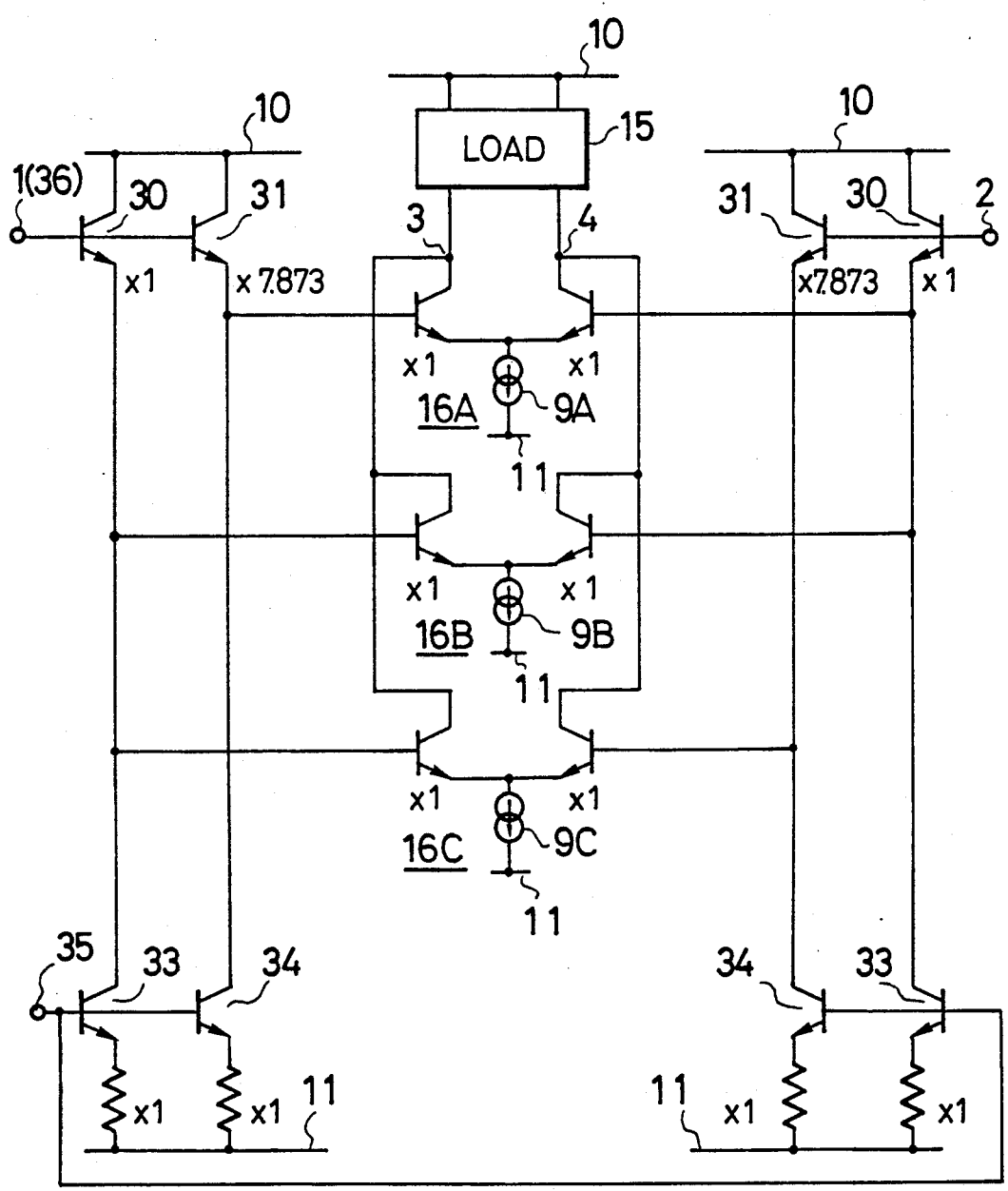
FIG. 11 is a circuit diagram of a differential amplifier in which the offset voltage generating circuit shown in FIG. 10A is used.

Accordingly, in the circuit composition shown in FIG. 11, which is composed of the circuit of FIG. 10A, by equally setting the emitter areas of the transistors 33 and 34 and setting the ratio of emitter areas of the transistors 30 and 31 at 1:7.87, a similar effect to the function obtained by the differential pair shown in FIG. 6 can be obtained.

Though the offset voltage supply means using the above-mentioned emitter follower is advantageous in that the frequency characteristic is improved, as compared with the embodiment shown in FIG. 9, in which the emitter area of the differential pair itself is changed, the total area occupied by the transistors composing the circuit is excessively large. To improve the problem, a method for reducing the area occupied by the transistors for the offset voltage means using the emitter follower will be described.

In the circuit shown in FIG. 10A for generating the offset voltage $Vd_1$, it should be noted that the offset voltage can be changed not only by the difference of the emitter areas of the transistors but also by these operational currents. Namely, by realizing the value of M in the equation (25) utilizing not only the ratio of the emitter areas of the transistors 30 and 31 but also the ratio of the operational currents, the desired offset can be obtained. Accordingly, by utilizing not only the area ratio or only the current ratio but both of them, the occupied area and the current value can be set at suitable values respectively.

Figure 10B:
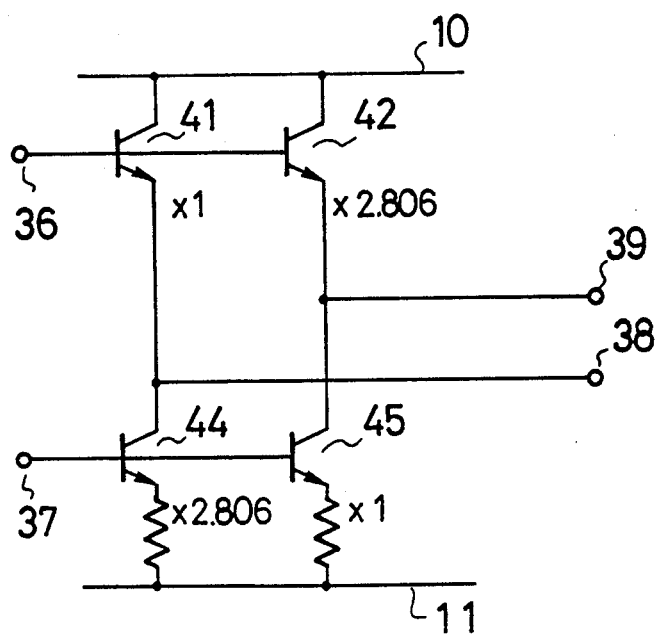

To reduce the area occupied by the transistors in the circuit, an example in which the emitter currents of the transistors are made different from each other is shown in FIG. 10B.

In FIG. 10B, to reduce the area occupied by the transistors as compared to the circuit in FIG. 10A, the emitter areas of the transistors 41, 42, 44, and 45 are set at $1:\sqrt{M}:\sqrt{M}:1$, i.e., about 1:2.806:2.806:1. By such an arrangement, a potential difference of about 56.3 mV can be generated at the output terminal 39 on the basis of the output terminal 38 at absolute temperature of 300 K. so that a high frequency characteristic preferable to that of the circuit of FIG. 3 can be obtained. The entire circuit composition in this case is shown in FIG. 12.

Considering the effect of reducing the area by the method, when the emitter area of the smallest transistor is 1, the effect can be expressed by the following equation in the circuit shown in FIG. 9.

$$7.87+1+1+1+1+7.87 \approx 19.74$$

While, when the offset voltage supply means of FIG. 10A is applied to a differential amplifier shown in FIG. 11, the effect is $2 \cdot (3+7.87)+6=27.74$. Moreover, when the offset supply means of FIG. 10B is applied to that of FIG. 12, the effect becomes $2 \cdot (2+2 \times 2.81)+6=21.24$, thus it is clearly seen that a circuit with higher performance but smaller area than that of FIG. 9 can be realized by applying the area reduction method shown in FIG. 10B.

Figures 13A, 13B:
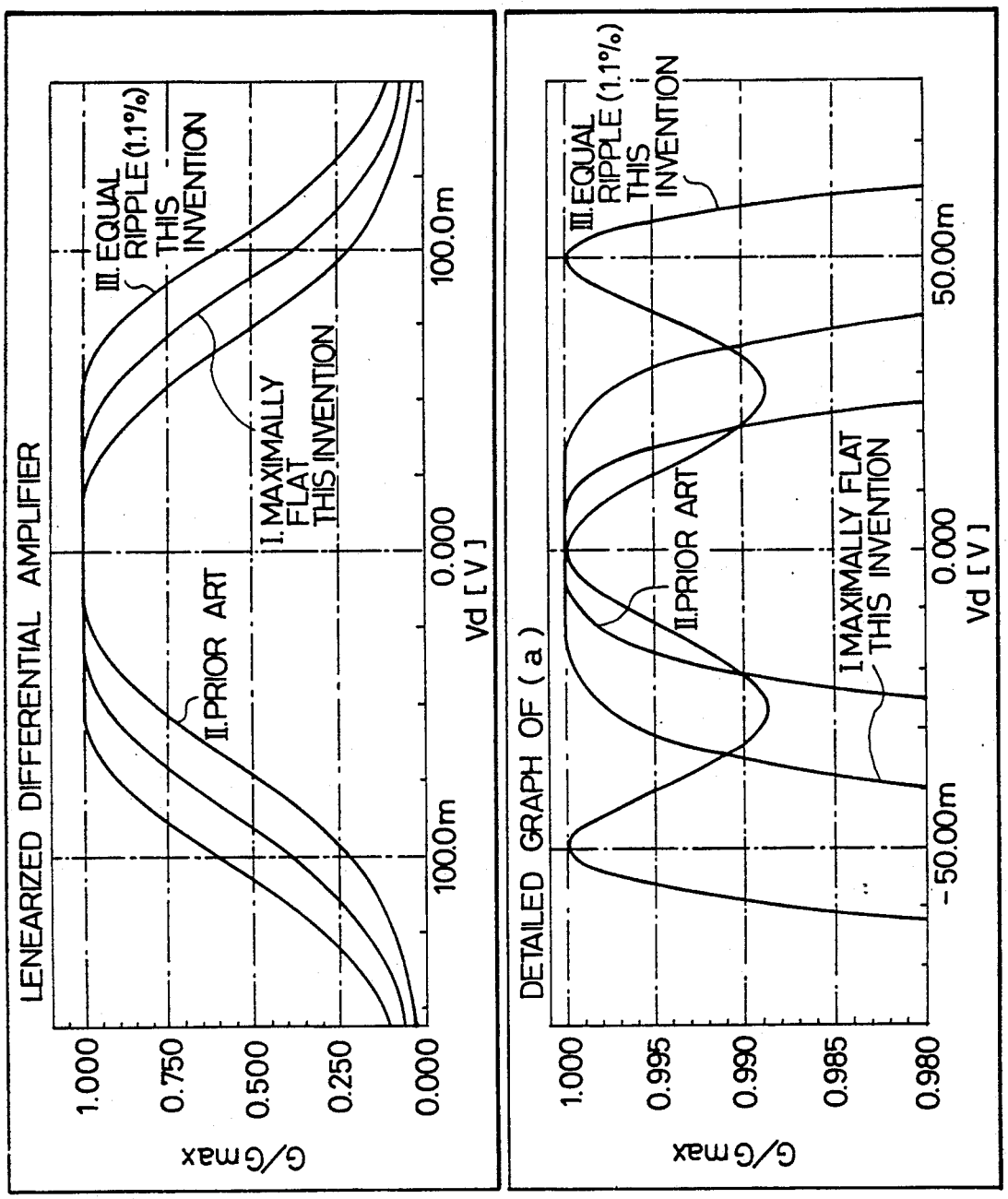
FIG. 13A is a diagram to show comparison of transconductances in the linearized differential amplifier of the first embodiment in the present invention (using the equal ripple approximation and the maximally flat approximation) and the conventional linearized differential amplifier.
FIG. 13B is a partly enlarged diagram of FIG. 13A.

To show the effect of enlarging the linear range related to the present invention more clearly, an amplifier using two sets of differential pairs according to the prior art and an amplifier using three sets of differential pairs related to the present invention are compared by normalized graphs on the input-output characteristic. FIG. 13 shows graphs on the transconductance characteristic, and the lateral axis is the differential input voltage and the vertical axis is the normalized transconductance.

In the same Figure, reference character I shows the transconductance characteristic of the present invention using the three sets of differential pairs, and II shows the transconductance characteristic where the two sets of differential pairs of the prior art are used. As clearly shown in the same drawing, the linear operation range can be much enlarged by the present invention.

To quantitatively compare the width of the linear range, the results obtained from investigation on the range of Vd where the transconductance G(Vd) normalized at the maximum value thereof is reduced by 1% from the maximum value are shown in Table 1.

TABLE 1

| Linear ranges with respect to respective linearization methods and conditions thereof | | | |
| --- | --- | --- | --- |
| Circuit type | $d_1$ | $\beta$ | Range of Vd where G is reduced by 1%[*2] |
| Ordinary differential pair | no | no | 10.3 mV (.248) |
| Conventional example[*1] | 0.6585 | no | 41.4 mV (1.00) |
| First embodiment | 1.0317 | 0.6400 | 69.7 mV (1.68) |
| Second embodiment | 1.3000 | 0.7593 | 119.0 mV (2.87) |

[*1] See J. C. Schmoock, IEEE J.S.C.C., SC-10, 6, pp. 407-411, 1975
[*2] At absolute temperature of 300K.
A numeral value in the parenthesis means a ratio to the conventional example.

With respect to the width of $V_d$ where $G(V_d)$ is reduced from the maximum value by 1% in the above table, the linear range of the embodiment is enlarged about 6.8 times as compared to the simple differential pair, and about 1.7 times as compared to the linearlized differential amplifier using two sets of conventional differential pairs.

Thus far, only the conditions used to realize the maximally flat characteristic to approximate the transconductance to a flat line were considered. However, there is the equal ripple approximation which allows constant waving as another approximation method. Thus, a wider linear range than the maximally flat approximation can be obtained by allowing the waving. Accordingly, an embodiment for realizing the equal ripple approximation in the linearized differential amplifier related to the present invention will be described below.

Analytical conditions concerning parameters necessary for the realization of the equal ripple characteristic can be introduced. However, it is necessary to solve non-linear simultaneous equations for obtaining them, and the calculation required is very difficult. Thus, approximate values of the parameters are numerically obtained by using a computer. For example, when the approximate values obtained are $a_1 = 1$,
$\beta = 0.7593$, and
$d_1 = 1.300$, the transconductance can be approximated to the equal ripple characteristic having a waving of about 1.1% of the maximum value thereof.

To realize the parameters in a circuit, it is natural that all the circuits of the embodiments related to the present invention described above can be utilized. In order to compare the effect of the embodiment with other cases, the embodiment of the equal ripple approximation is shown by sign III in FIG. 13. As clearly seen from FIG. 13A, the flat range of the curve is wider than that in case of the maximally flat approximation. However, seen in detail from the partially enlarged view in FIG. 13B, waving of the curve can be observed.

For example, when the current mirror shown in FIG. 4B is used as the load circuit, a current proportional to the transconductance of a differential input voltage applied between the input terminals 1 and 2 can be supplied to another load connected to the output terminal 4.

Next, composition and operation of the linearized differential amplifier as a third embodiment of the present invention using four sets of differential pairs will be described.

Figure 14:
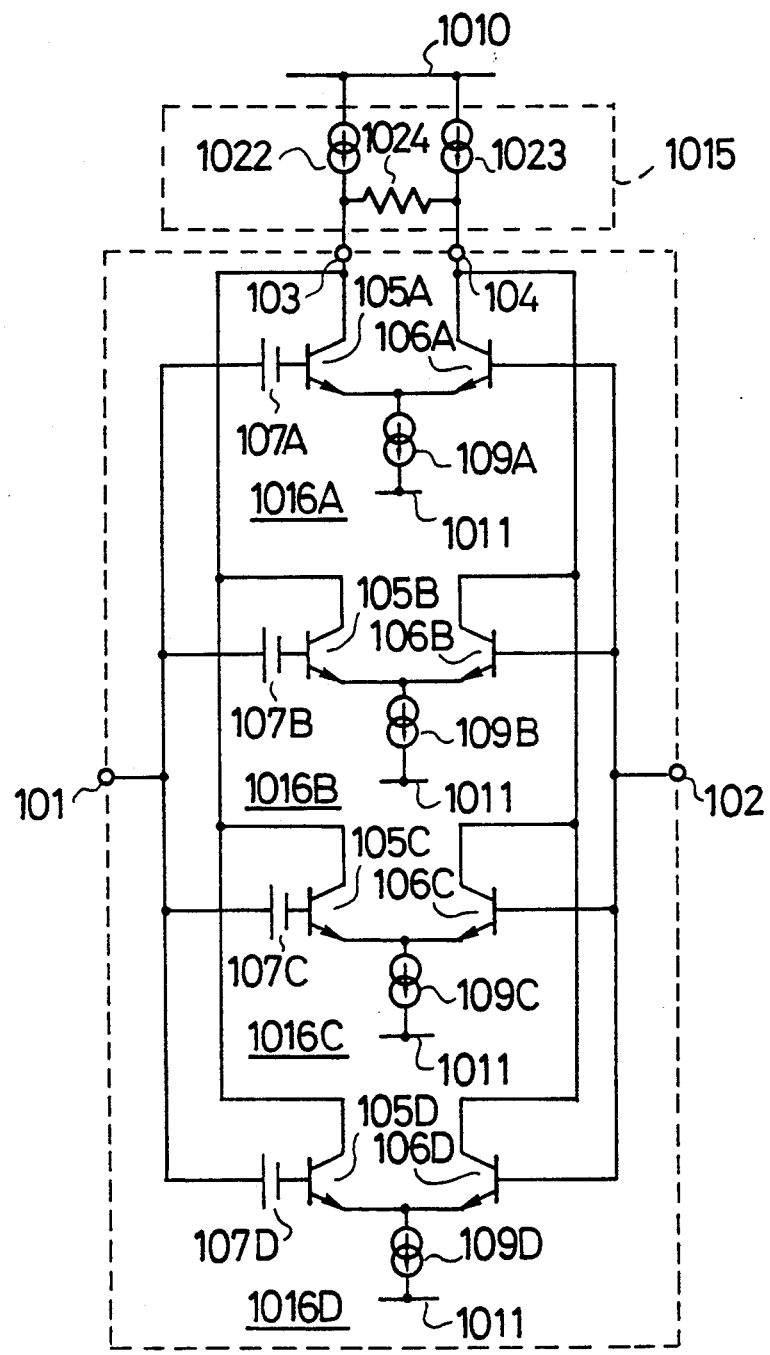
FIG. 14 is a circuit diagram to show a third embodiment (comprising four differential pairs) of the present invention.

FIG. 14 is a circuit diagram to explain composition of the third embodiment of the present invention. In the same drawing, reference numeral 1015 designates a load, 1016A, 1016B, 1016C, and 1016D designate a first to a fourth differential pair, 107A, 107B, 107C, and 107D show dc voltage sources as offset voltage supply means, 109A, 109B, and 109D show current sources respectively connected to common emitters of the first to the fourth differential pair, 101 and 102 show input terminals, and 103 and 104 show output terminals.

First, a method of determining specific values of the voltage sources 107A, 107B, 107C, 107D and the current sources 109A, 109B, 109C, 109D are described. The equation (6) for the general expression is modified specifically to the case in which four differential pairs are used. Then, the following equation is obtained.

$$G(x) = \alpha_1[Gm(x-d_1) + Gm(x+d_1)] + \alpha_2[Gm(x-d_2) + Gm(x+d_2)] \quad (29)$$

When explained on the circuit, the equation (29) means a sum of the output of two sets of differential pairs having an offset of $d_1$ and the output of the remaining two sets of differential pairs having an offset of $d_2$ at the rate of $\alpha_1$ and $\alpha_2$. With respect to the weights $\alpha_1$ and $\alpha_2$, the ratio is most important, and the generality of the equation (29) is not lost when assuming $\alpha_2 = 1$. Thus, the equation (29) will be explained based on the condition. Moreover, since the equation is symmetrical, the generality is not lost under the following assumption:

$$0 < d_1 < d_2 \quad (30)$$

Accordingly, the equation (29) can be changed as follows:

$$G(x) = \alpha_1[Gm(x-d_2) + Gm(x+d_2)] + [Gm(x-d_2) + Gm(x+d_2)] \quad (31)$$

This equation (31) is symmetrical with respect to $x=0$, thus the derivatives of odd orders of $G(x)$ become zero at $x=0$. Accordingly, in order to obtain the transconductance characteristic which is flat over a wide range, it is necessary to determine the parameters so that the derivatives of even orders become zero at $x=0$ up to the highest possible order.

Therefore, the parameters $d_1$, $d_2$, and $\alpha_1$ are obtained so as to make $G''(0)$ and $G''''(0)$ be zero in equation (31). In this case, the primary accent (') shows differentiation with respect to x. First, the conditions which make the differential coefficient of the second order be zero are considered.

$$G''(0) = 2\alpha_1[-3X^4 + 4X^2 - 1] + 2[-3Y^4 + 4Y^2 - 1] \quad (32)$$

where $$X = \tan h^2(d_1), \; Y = \tan h^2(d_2). \quad (33)$$

Accordingly, it is necessary that X and Y satisfy $$0 \leq X < 1, \; 0 \leq Y < 1.$$

When the equation (32) is solved with respect to Y, the following equation (34) is obtained.

$$Y = [4/3 \pm (16/9 - 4/3) \cdot \{1 - \alpha_1(-3X^2 + 4X - 1)\}]/2 \quad (34)$$

In this equation (34), when $$F = -3X^2 + 4X - 1, \quad (35)$$

the condition of F to satisfy $0 \leq Y < 1$ is determined as follows by a simple calculation.

$$-1/3F \leq \alpha_1 < 1/F \quad \text{for } F > 0 \quad (36)$$
$$1/F \leq \alpha_1 < -1/3F \quad \text{for } F < 0$$

When a value of F is once determined, the range of F is $-1 < F < \frac{1}{3}$, corresponding $\alpha_1$ to F can be changed over all the positive and negative range.

Accordingly, the procedure to obtain conditions which make $G''(0)$ be zero is composed of the following steps (I) to (V).

(I) One of X which satisfies $0 \leq X < 1$ is chosen (or selected).

(II) A value of F given by the equation (35) is calculated.

(III) A possible range of $\alpha_1$ is determined by the equation (36), then one of $\alpha_1$ is selected from the range.

(IV) The values of F and $\alpha_1$ are substituted into the equation (34) to calculate a value of Y.

(V) The values of X, Y and $\alpha_1$ determined through the steps (I), (III) and (IV) are the parameter set which satisfies $G''(0) = 0$.

As clearly seen from the procedure, the ranges of X and $\alpha_1$ are in some relation to each other, and a possible range of Y is determined through a value of $\alpha_1$. Accordingly, even when the condition which makes the differential coefficient of the second order be zero is imposed, it is possible to select a specific Y from the possible range of Y. Moreover, it is possible that this possibility further makes differential coefficients of other higher orders be zero. Therefore, the condition which makes the differential coefficient of the fourth order be zero is now investigated. The differential coefficient of the fourth order is given by the following equation (37).

$$G''''(0) = 16(-15Y^3 + 30Y^2 - 17Y + 2) + 16\alpha_1 \cdot (-15X^3 + 30X^2 - 17X + 2) \quad (37)$$

where X, Y and $\alpha_1$ satisfy the conditions described in the steps (I) through (V).

With a computer, a value of the equation (37) is numerically estimated. At the time, not only the equation is estimated by giving $d_2$, but also a value of Y, i.e., a value of $d_1$ which makes the differential coefficient of the fourth order be zero and the differential coefficient of the sixth order based on Y or $d_1$ are calculated by repeated calculations.

According to the calculation results, it is found that there are solutions which satisfy $G(0) \neq 0$ and $G''''(0) = 0$ in the ranges of $d_2 \geq 1.147$ and $d_2 \geq 2.358$. While, in a range other than these ranges, the transconductance itself as well as the differential coefficients of respective orders becomes zero, thus the solution obtained based on the range is not useful for the circuit.

Moreover, since the differential coefficient of the sixth order is zero in the vicinity of $d_2=1.2977$, the maximally flat characteristic of the seventh order can be obtained under the condition.

Accordingly, in equation (31), under the conditions:
$d_1=0.354071095$,
$d_2=1.297724854$, and
$a_1=0.5478454142$,
the maximally flat characteristic of the seventh order can be obtained.

Next, an example for applying the results obtained described above to a real circuit will be explained.

When the variables x and y normalized as in the equation (3) are returned to the original ones respectively, the following equations (38), (39) are obtained.

$$I_d = y \cdot \alpha_F / I_{EE} \quad (38)$$

$$V_d = -X \cdot 2 V_T \quad (39)$$

Accordingly, when an offset voltage corresponding to $d_k$ is designated by $Vd_k$, the following equation (40) is established.

$$Vd_k = -d_k \cdot 2 V_T, (k=1, 2) \quad (40)$$

Specifically, the offset voltages $Vd_1$, $Vd_2$ respectively corresponding to these $d_1$, $d_2$ are calculated as follows based on the equation (40) at absolute temperature of 300 K.

$$Vd_1 = -0.354071095 \cdot 2V_T \quad (41)$$
$$= -18.30 mV$$

$$Vd_2 = -1.297724854 \cdot 2V_T \quad (42)$$
$$= -67.07 mV$$

Therefore, in the circuit composition shown in FIG. 14, comprising connecting the input terminals and the output terminals of the four sets of differential pairs in parallel respectively, it is possible to realize the maximally flat characteristic of the seventh order, for example, by using dc voltage sources of $-18.30$ mV and $+18.30$ mV as the offset voltage supply means 107B and 170C respectively, dc voltage sources of $-67.07$ mV and $+67.07$ mV as 107A and 107D, and the current sources 109A, 109B, 109C and 109D respectively connected to the common emitters of the differential pairs as the weighting means for weighting output currents, so as to set the current values at the ratio of about

1:0.54781:0.54781:1.

In this case, the current sources 1022 and 1023 of the load 1015 are used for determining dc operational points of the circuit, and these are set at a half value of the sum of current values of the current sources 109A, 109B, 109C, 109D.

To explain operation of the circuit set as described above more intuitively, dependence of the differential output current on the differential input voltages of the respective differential pairs 1016A, 1016B, 1016C, 1016D of FIG. 14 is shown by graphs 1025, 1027a, 1027b, 1026 respectively in FIG. 15A. Since the respective output terminals of the differential pairs are connected in parallel, the differential output current in the load resistance 1024 is the sum of these currents, thus it is expressed by a curve designated by reference numeral 1028 in FIG. 15A as the sum of curves of the graphs 1025, 1027a, 1027b and 1026.

As clearly seen from the same diagram, the curve 1028 has a wider linear range than any of 1025 to 1027.

To explain this fact more clearly, curves obtained by differentiating the curves 1025 to 1028, i.e., curves of the transconductances thereof are shown by the same reference numerals with primes (') respectively in FIG. 15B. From the same drawing, it is understood that a curve 1028' of the transconductance of the differential amplifier in this embodiment provides a linear operation range nine times as wide as that of 1026' obtained by parallel shifting of that of the ordinary differential pair.

Figure 16:
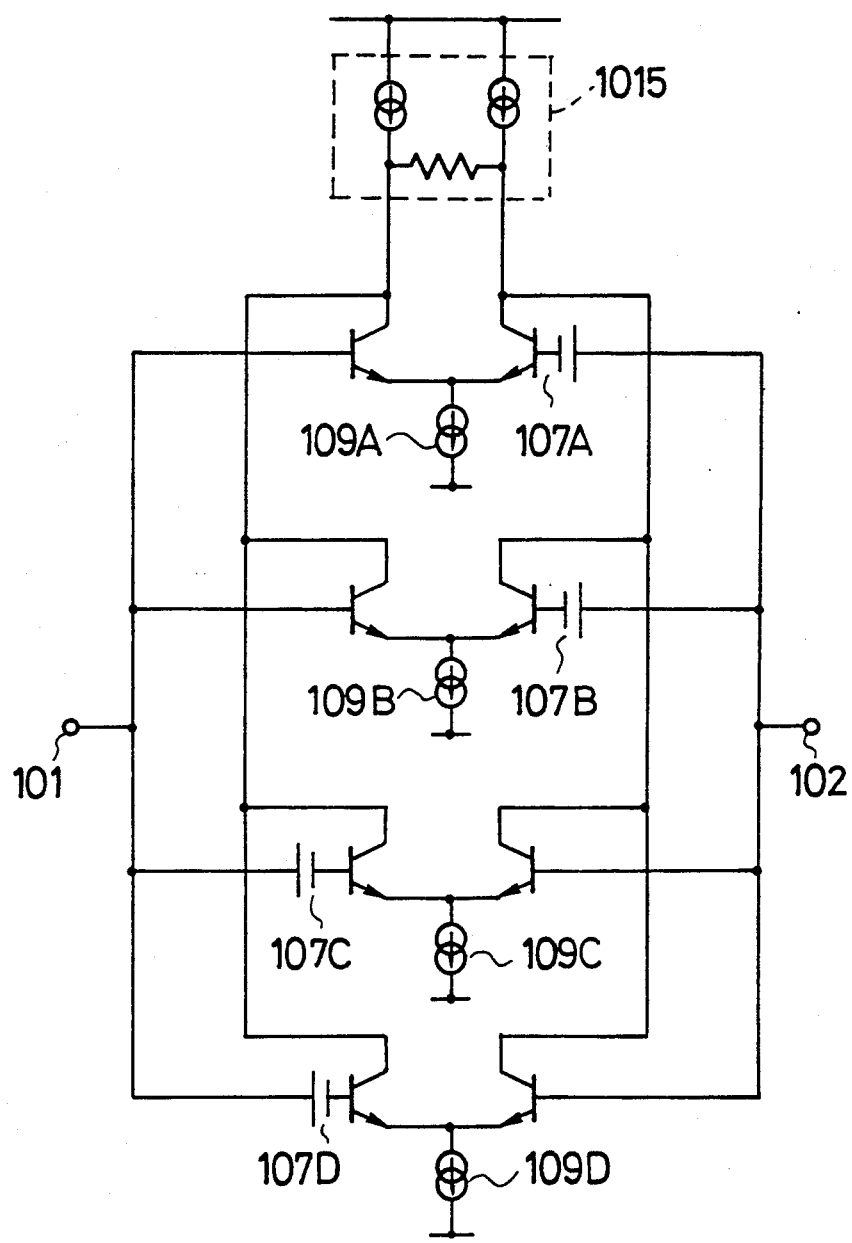
FIG. 16 is a circuit diagram to show a modified example of the offset voltage generating circuit shown in FIG. 14.

In the circuit shown in FIG. 14, the voltage supply means 107A, 107D (107B, 107C) are added to the transistors 105A, 105D (105B, 105C) composing the differential pairs 1016A, 1016D (1016B, 1016C) respectively. However, the same effect can be obtained, by utilizing the characteristics of the differential pair, by eliminating 107A (107B) by short and adding a voltage source having an equal voltage value to 107A (107B) between the base terminal and the input terminal 102 of the transistor 106A (106B) so that the positive pole thereof is on the side of the input terminal 102. FIG. 16 shows this circuit configuration.

Moreover, an example in which another method is used as the offset voltage supply means is explained with reference to FIG. 17. In this method, each differential pair having an offset function is obtained by making emitter areas of the two transistors composing the differential pair different on purpose.

Namely, when a voltage between the base and the emitter of a transistor is Vbe, and the collector current thereof is Ic, the following equation (43) is established.

$$V_{b\theta} = V_T \log_\theta [Ic/Is] \quad (43)$$

where $V_T$ and Is are the thermal voltage and the reverse collector saturation current respectively. Since Is is in proportion to the emitter area, when an emitter area of one transistor in the differential pair is set M times as large as that of the other, and the collector currents are same, the base-emitter voltage Vbe of the transistor is expressed as follows:

$$V_{b\theta} = V_T \log_\theta [Ic/MIs] \quad (44)$$

Accordingly, when the difference of the base-emitter voltages of both transistors is expressed by $\Delta V_{b\theta}$, $\Delta V_{b\theta}$ can be expressed by the following equation (45).

$$\Delta V_{b\theta} = V_T \log_\theta [Ic/Is] - V_T \log_\theta [Ic/MIs] \quad (45)$$
$$= V_T \log_\theta (M)$$

Thus, the asymmetrical differential pair is apparently equivalent to a differential pair having an offset voltage of $V_T \log \theta(M)$.

In case of this embodiment, M should be so determined as to establish the following equation (46).

$$V_T \log_\theta (M) = d_k \cdot 2 V_T (k=1, 2) \quad (46)$$

Thus, when $M_1$ and $M_2$ are values of M which satisfy the equation (46) in the respective cases that k is 1 and 2, these are expressed as follows:

$$M_1 = \exp(2d_1) = 13.40261 \quad (47)$$

$$M_2 = \exp(2d_2) = 2.030215 \tag{48}$$

The ratio of the emitter areas in the transistors composing the differential pair should be set at 1:13.40261 or 1:2.030215.

This offset voltage supply means is superior to the embodiment shown in FIG. 14 and FIG. 16 in that the temperature compensation is not required. Namely, when dc voltage sources are used as the offset voltage supply means, it is necessary that the values be in proportion to $V_T$ as given in the equation (40) while, the offset voltage supply means using the difference of emitter areas can automatically generate suitable offset voltages corresponding to any given temperature because $V_T$ are cancelled each other as seen from the equation (46).

Figure 17:
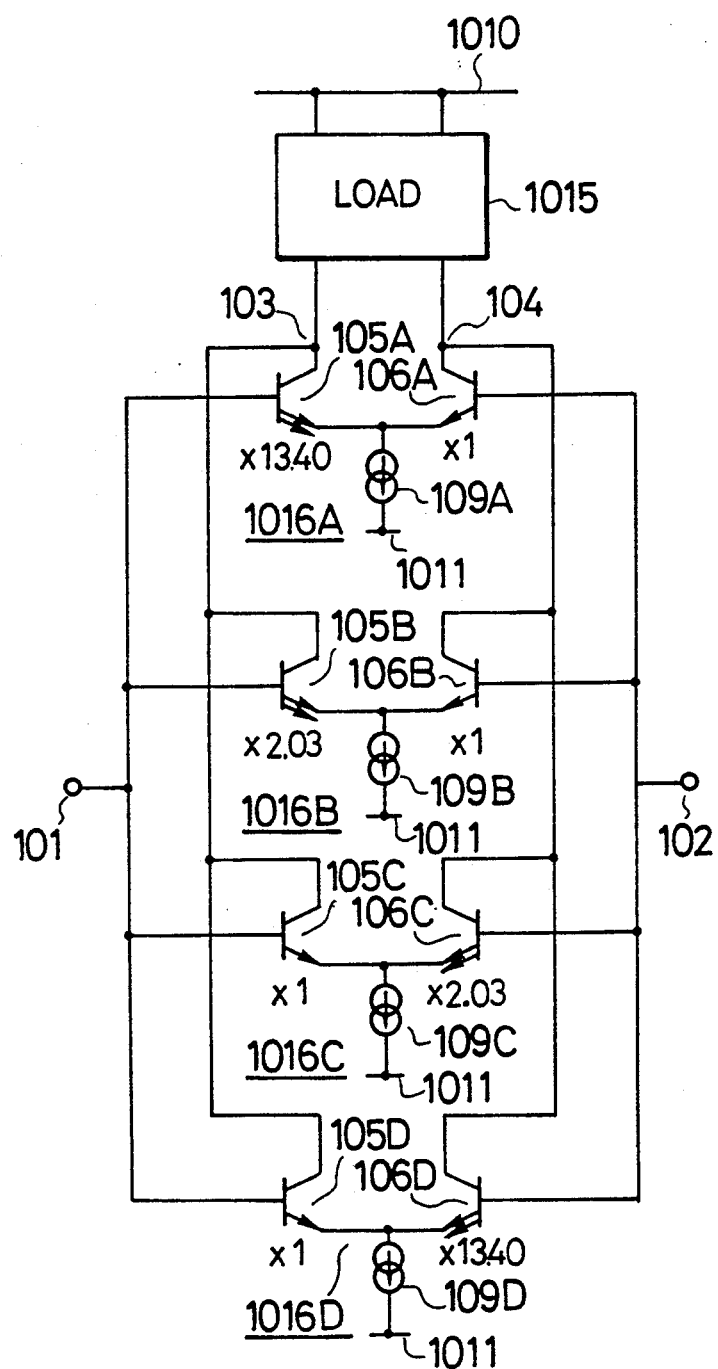
FIG. 17 is a circuit diagram to show another modified example of the offset voltage generating circuit.

FIG. 17 is an example of a circuit of the fourth embodiment. In the same drawing, a markedly different point from FIG. 14 and FIG. 16 is that the offset voltage supply means is realized not by voltage sources but by the difference of emitter areas of the differential pair.

In FIG. 17, the offset supply means is realized by setting the emitter areas of transistors 105A and 106D about 13.40 times as large as those of transistors 106A and 105D, and setting the emitter areas of transistors 105B and 106C about 2.03 times as large as those of transistors 106B and 105C.

Figure 18A:
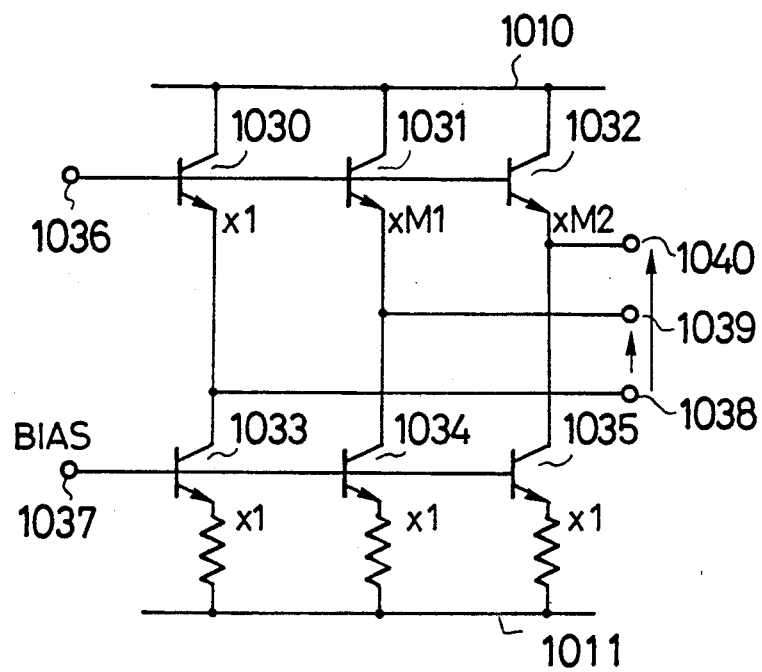
FIGS. 18A and 18B are circuit diagrams to show other modified examples of the offset voltage generating circuit.

Moreover, another modified example will be explained hereinafter. FIG. 18A shows a circuit for generating the offset voltages $V_{d_1}$, $V_{d_2}$. It should be noted that the offset voltages can be changed by differences of emitter areas of transistors 1030, 1031, 1032 respectively composing the emitter follower.

Namely, desired offset can be also obtained by replacing the value of M in equation (46) with the emitter area ratio of the transistors 1030, 1031 and 1032. In this case, current sources respectively comprising transistors 1033, 1034 and 1035 are provided to flow equal currents in the transistors 1030, 1031 and 1032. The transistors 1033, 1034 and 1035 are transistors with the same emitter areas, and are given equal voltages at the base terminals thereof through a terminal 1037. Since the condition is the same as the case where the equation (45) is introduced, by setting the ratio M1 of emitter areas of the transistors 1030 and 1031 at about 1:2.03 and the ratio M2 of emitter areas of the transistors 1030 and 1032 at about 1:13.40, it is becomes possible to give a potential difference expressed by the equation (40) between the output terminals 1038 and 1039, and 1038 and 1040 by applying a suitable voltage to an input terminal 1036.

By setting as mentioned above, potential differences of 18.30 mV and 67.07 mV can be generated at the output terminals 1039 and 1040 on the basis of the output terminal 1038 at absolute temperature of 300 K., so that an effect similar to that of the circuit in FIG. 3 can be obtained.

Moreover, since respective differential pairs of a differential amplifier, which are composed of the circuits shown in FIG. 18A for generating the offset voltages can be composed of transistors all having the same emitter area, it is possible to obtain the maximally flat characteristic of the seventh order, which is superior in the high frequency characteristic to the circuit in FIG. 17 including transistors having large emitter areas.

Next, still another modified example will be described. As described above, FIG. 18A shows a circuit for generating offset, however it is possible to change the offset voltage not only by the differences of emitter areas of the transistors 1030, 1031 and 1032 but also by these operational currents.

Namely, desired offset can be also obtained not only by the ratio of emitter areas of the transistors 1030, 1031 and 1032 but also by the ratio of these operational currents as the value of M in the equation (46).

In this case, to equally set the emitter areas of the transistors 1030, 1031, 1032 and flow currents at the ratio of $M_2:M_1:1$, it is necessary to provide current sources respectively comprising transistors 1033, 1034 and 1035. Namely, in this case, the transistors 1033, 1034 and 1035 are transistors respectively having emitter areas at the ratio of $M_2:M_1:1$, and are given equal voltages at the bases through a terminal 1037. Since the condition is the same as in the case where equation (45) is introduced, a voltage applied to an input terminal 1036 is so set as to generate a potential difference designated by the equation (40) between output terminals 1038 and 1039.

Figure 19:
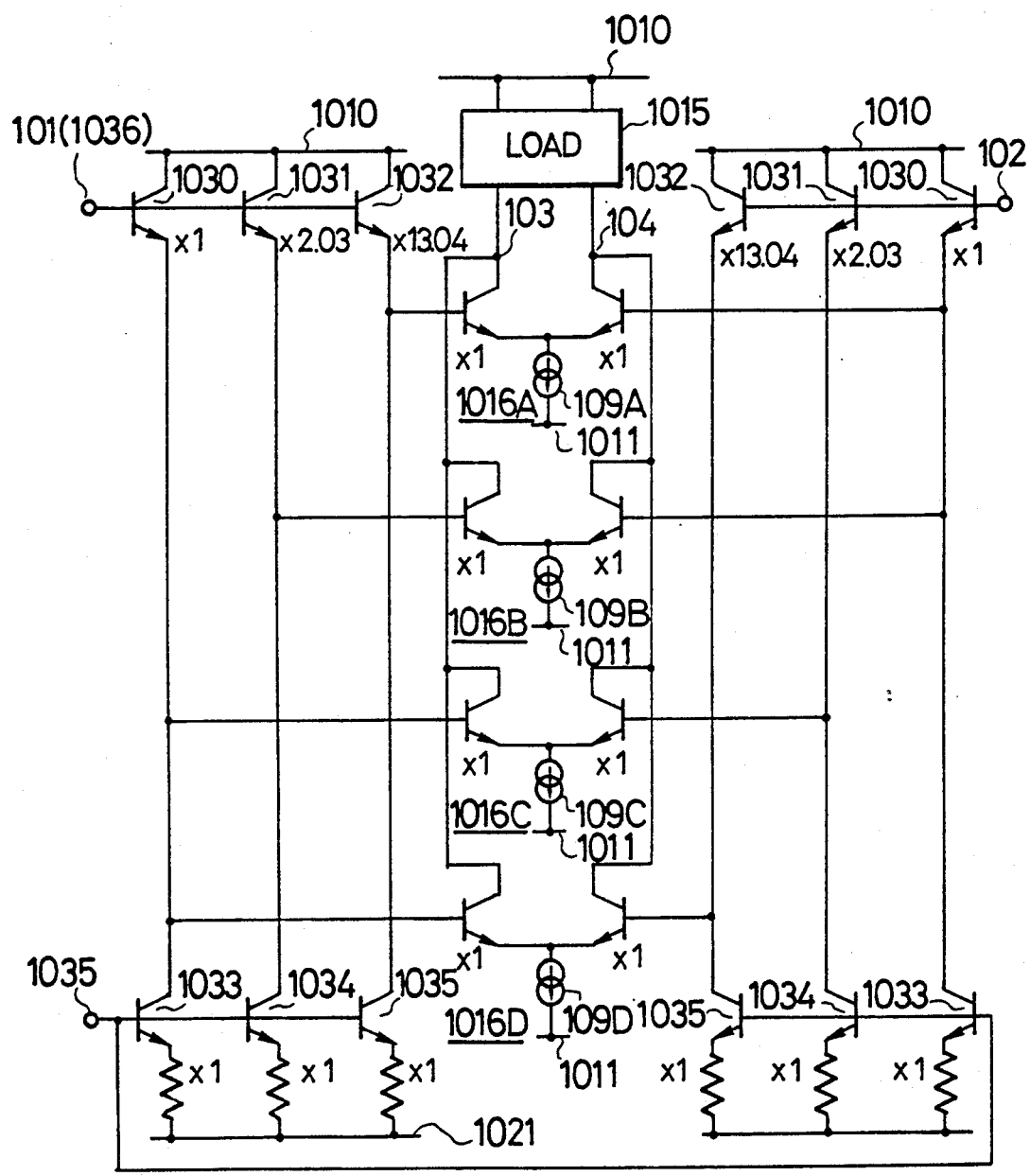
FIG. 19 is a circuit diagram of a differential amplifier in which the offset voltage generating circuit shown in FIG. 18A is used.

Accordingly, in the circuit composition of FIG. 19, which is composed of the circuit shown in FIG. 18A, a similar effect to the circuit of FIG. 14 can be obtained by equally setting the emitter areas of the transistors 1033, 1034 and 1035, and setting the ratio of emitter areas of the transistors 1030, 1031 and 1032 at 1:2.03:13.04.

Though the frequency characteristic can be improved by the offset voltage supply means using the emitter follower as mentioned above, the total area occupied by the transistors to compose the circuit becomes relatively large as compared to the embodiment shown in FIG. 17 to change the emitter areas of differential pairs. To improve this point, a method of reducing the area occupied by the transistors in the offset voltage supply means using the emitter follower will be described hereinafter.

In the circuit of FIG. 18A for generating the offset voltages $V_{d_1}$, $V_{d_2}$, it should be noted that the offset voltage can be changed not only by the difference of emitter areas of transistors but also by these operational currents. Namely, desired offset can be obtained by realizing the value of M in equation (44) using not only the ratio of emitter areas of the transistors 1030, 1031, 1032 but also the ratio of these operational currents.

Accordingly, it should be also considered to suitably set the area occupied and the current values by not utilizing only the ratio of the areas or that of the currents but utilizing both of them.

Figure 18B:
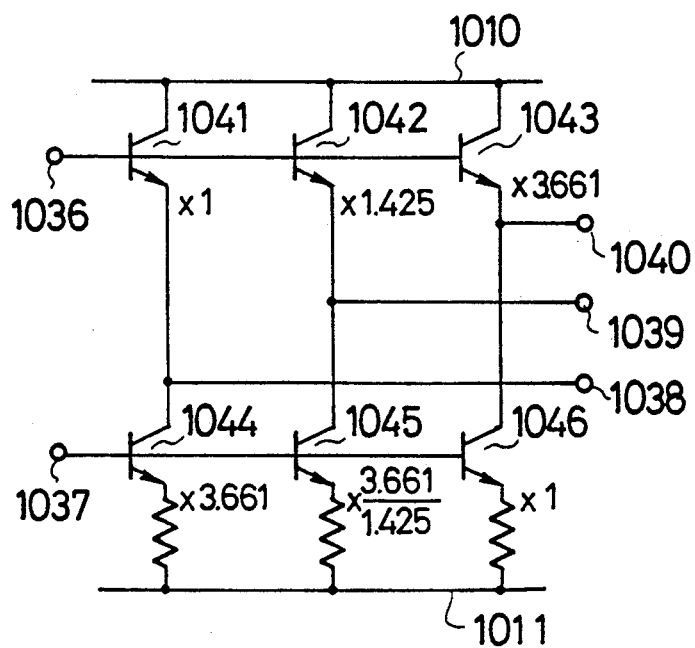

To reduce the area occupied by transistors in the circuit, an example in which the emitter currents of the transistors are made different is shown in FIG. 18B.

In FIG. 18B, to reduce the area occupied by transistors as compared to the example shown in FIG. 18A, emitter areas of transistors 1041, 1042, 1043, 1044, 1045 and 1046 are set at the ratio of $$1:\sqrt{M_2}:\sqrt{M_1}:\sqrt{M_1}:\sqrt{M_1/M_2}:1,$$

i.e., about $$1:1.425:3.661:3.661:2.569:1.$$

Figure 20:
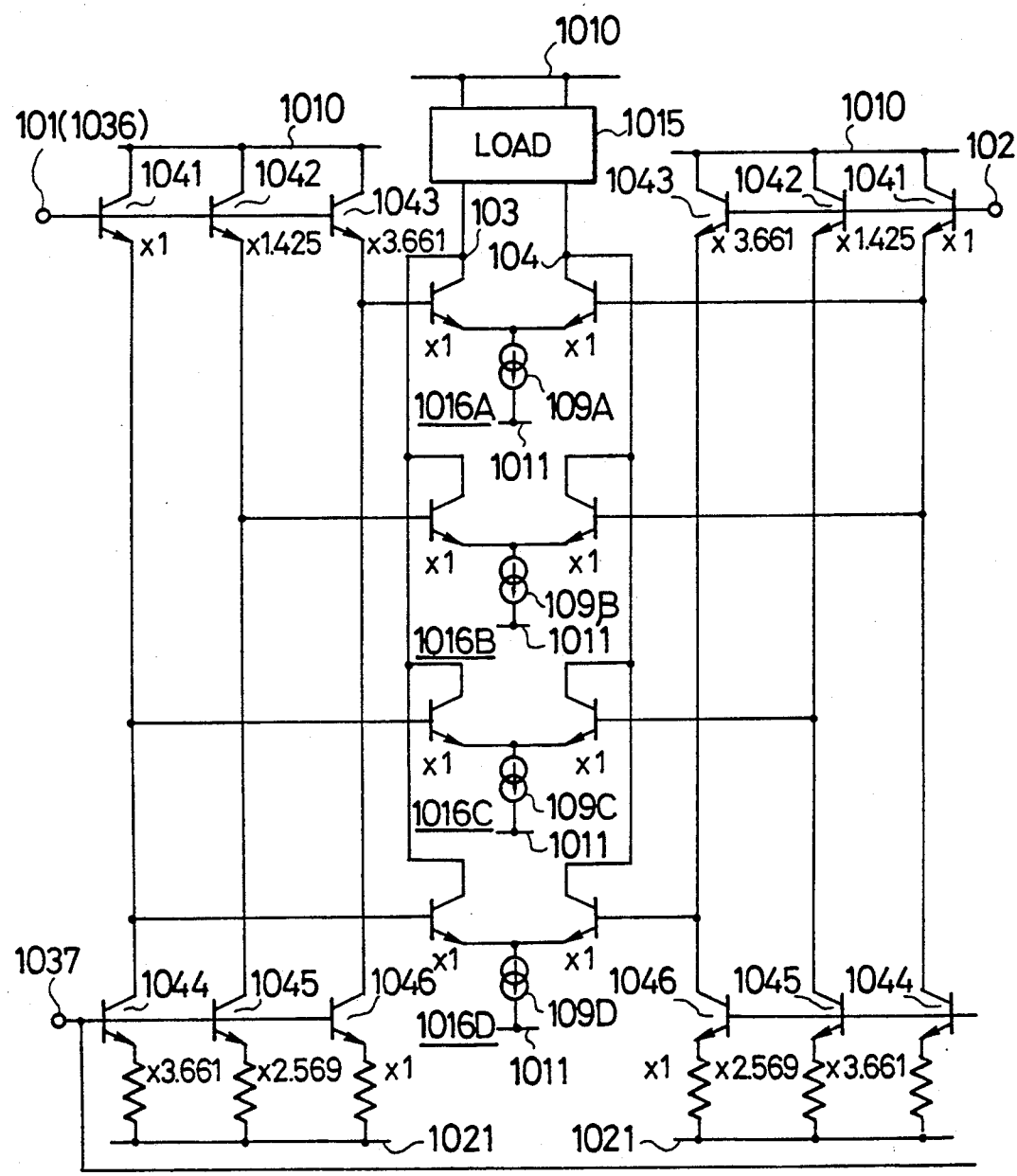
FIG. 20 is a circuit diagram of a differential amplifier in which the offset voltage generating circuit shown in FIG. 18B is used.

By the setting, potential differences of about 18.30 mV and 67.07 mV can be generated at output terminals 1030 and 1040 on the basis of an output terminal 1038 at absolute temperature of 300 K. Thus, a high frequency characteristic which is preferable to that of the circuit shown in FIG. 14 can be obtained. The entire circuit composition in this case is shown in FIG. 20.

Comparing the effect of area reduction, when an emitter area of the smallest transistor is 1, the area reduction in the circuit of FIG. 17 is calculated as follows:

$$2\cdot(13.40+1+2.03+1)=34.86.$$

While, when the offset voltage supply means of FIG. 18A is applied to the differential amplifier in FIG. 19, the effect is expressed by the following equation.

$$2\cdot(1+1+2.030+1+13.40+1+4)=46.86$$

Moreover, when the offset voltage supply means of FIG. 18B is applied to the differential amplifier in FIG. 20, the effect is $$2\cdot(1+3.661+1.425+2.569+3.661+1+4)=34.63.$$

Accordingly, when the area reduction method shown in FIG. 18B is applied, though the number of elements required is increased, it is possible to realize a circuit with a smaller area but higher performance as compared to the circuit shown in FIG. 14.

Figure 21A:
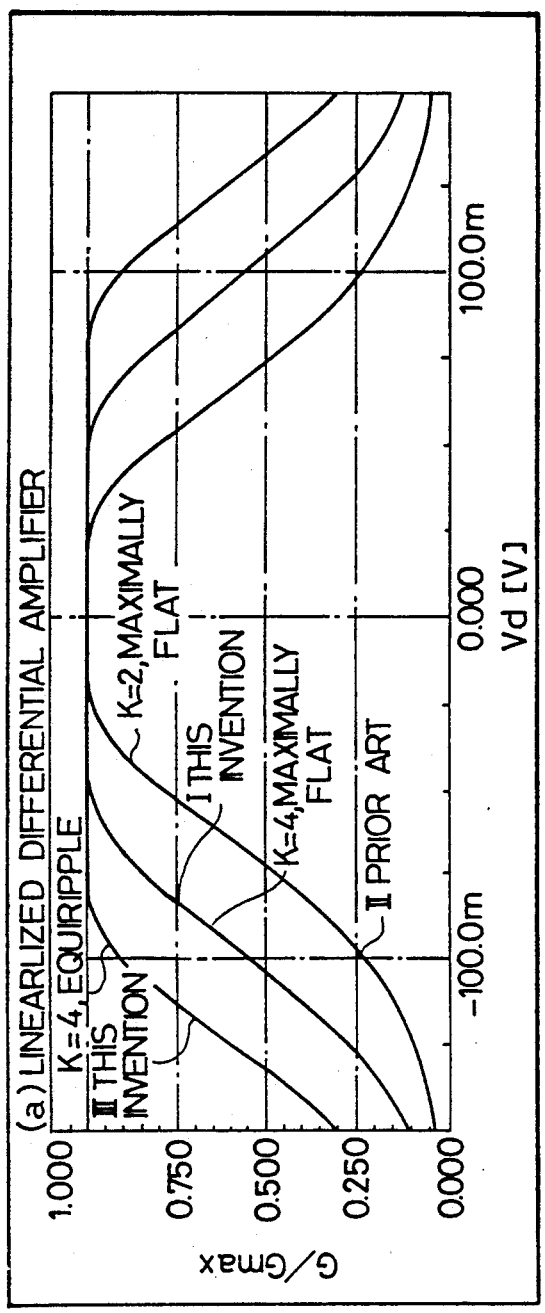
FIG. 21A is a diagram to show a comparison of transconductances in the linearized differential amplifier of the third embodiment in the present invention (using the equal ripple approximation and the maximally flat approximation) and the conventional linearized differential amplifier.
Figure 21B:
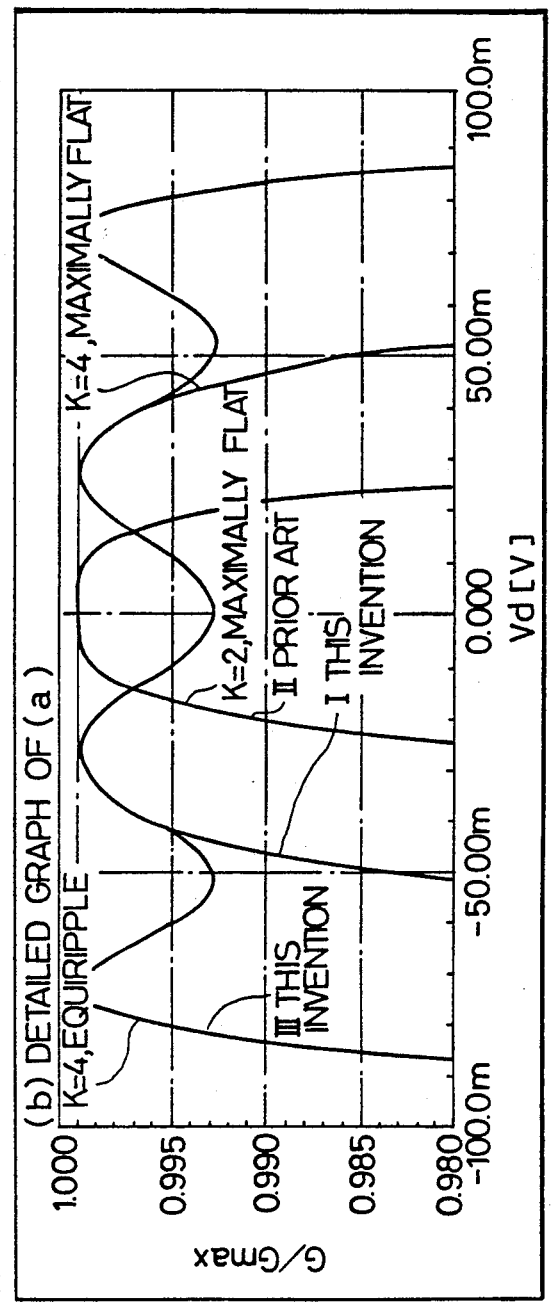
FIG. 21B is a partly enlarged diagram of FIG. 21A.

To show more clearly the effect of enlarging the linear range related to the present invention, the amplifier of the present invention, in which four sets of differential pairs are used, and the conventional amplifier in which two sets of differential pairs are used are compared based on graphs of normalized input-output characteristics thereof. FIGS. 21 shows graphs of the transconductance characteristics, and the lateral axis is the differential input voltage and the vertical axis is the normalized transconductance.

In the same diagram, reference character I shows the transconductance characteristic of this invention where four sets of differential pairs are used, II shows the transconductance characteristic of the conventional case where two sets of differential pairs are used. As clearly seen from the same diagram, the linear operation range can be much enlarged by the present invention.

To quantitatively compare the widths of the linear ranges, results obtained by investigation of the width (peak to peak) where each the transconductance $G(V_d)$ which is normalized at the maximum value thereof is reduced by 1% from the maximum value are shown in Table 2.

TABLE 2

Linear ranges with respect to respective linearization methods and conditions thereof

| Number of differential pairs | $d_1$ | $d_2$ | $\alpha_1$ | $\beta_1$ | Width of 1% (P-P)[c] |
|---|---|---|---|---|---|
| 1 set[a] | no | no | no | no | 10.3 mV (.248) |
| 2 sets[b] | 0.658479 | no | no | no | 41.4 mV (1.00) |
| 4 sets | 0.354071 | 1.297725 | 0.547845 | no | 96.3 mV (2.32) |

[a]Simple differential pair.
[b]Conventional linearized amplification pair.
[c]A number in the parenthesis shows a ratio to the case of b.

From the table for comparing the widths of $V_d$ where $G(V_d)$ is reduced by 1% from the maximum value thereof, in the case where four sets of differential pairs are used, the linear range is enlarged about 9.35 times as compared to the simple differential pair or about 2.32 times as compared to the linearized differential amplifier where conventional two sets of differential pairs are used.

As understood from the above description, even in the case where 5 sets or more of differential pairs are used, it is clearly possible to realize the linearization over a wide range in the same manner. However, in such a case, differing from the cases up to four sets, the parameters for giving the maximally flat characteristic can not be obtained analytically, thus they must be obtained by numerical calculations.

Heretofore, the conditions for realizing the maximally flat characteristic are described so as to possibly approximate the transconductance to a horizontal line. There is the equal ripple approximation as another approximation method, where constant waving is allowed. In the method, since waving is allowed, a linear range wider than the maximally flat approximation can be obtained. Therefore, an embodiment for realizing the equal ripple approximation on the linearized differential amplifier using four sets of differential pairs will be described next.

It is possible to introduce conditions for analyzing parameters required for realizing the equal ripple characteristic. However, this work needs to solve difficult non-linear simultaneous equations. Thus, approximate values of the parameters are numerically obtained by using a computer. For example, when these values are $\alpha_1=0.72$,
$\alpha_2=1$,
$d_1=0.55$, and
$d_2=1.794$, the transconductance shows an equal ripple characteristic having waving of about 0.75% with respect to the maximum value thereof.

To realize the parameters in a circuit, it is natural that all the circuits described in the embodiments of the invention can be utilized. To compare the effect of the embodiment with other cases, the embodiment of the equal ripple approximation is shown by sign III in FIG. 21. As clearly seen from FIG. 21A, the linear range is wider than that of the maximally flat approximation. However, as shown in the partially enlarged view in FIG. 21B, waving can be observed.

Moreover, according to the present invention, as easily understood from the manner of synthesizing transconductances of respective differential pairs shown in FIGS. 7B and 15B, when the weighting factors of offset voltage values and output currents are suitably changed from those for giving the maximally flat characteristic respectively, it becomes possible to enlarge the range where the transconductance is apparently constant though the flatness thereof is very slightly reduced lowered.

Moreover, in these embodiments, though NPN transistors are used as the transistors composing the differential pairs, it is possible to obtain similar effects to these embodiments if the transistors are PNP transistors. As the bipolar transistor, any of those comprising germanium, silicon and gallium arsenide presents similar effect. Of course, a heterobipolar transistor can be used instead.

In short, all the construction where four sets or more of differential pairs are connected in parallel so as to enlarge the linear range of the transconductance should be included in the scope of the present invention.

Moreover, in these embodiments, only application of the invention to amplifiers is described, it should be understood that this invention can be also preferably applied to filters, limiters and mixers.

(1) Embodiment as a Limiter

Figure 22:
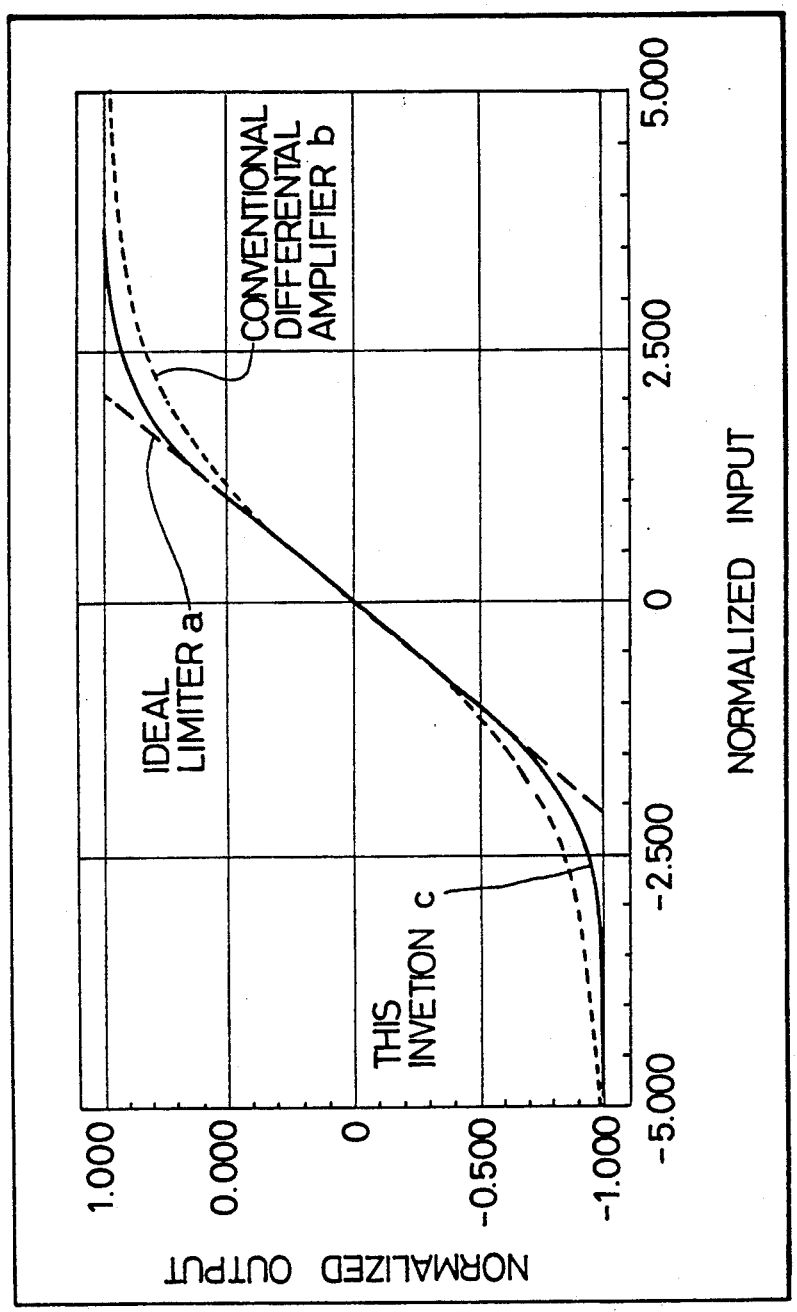
FIG. 22 is a diagram to show comparison with respect to these linearized amplifiers as shown in FIG. 21A input-output characteristics after being normalized.

Next, an embodiment of the present invention with respect to a limiter will be explained. Namely, as clearly understood from FIG. 15A, according to this invention, the input-output characteristic as designated by reference numeral 1028 can be realized when N is 4, which curves sharper than that of the conventional simple differential amplifier (for example, the one designated by referential numeral 1025). FIG. 22 shows comparison with respect to these input-output characteristics after being normalized. In the same drawing, the input-output characteristic according to this invention designated by c is nearer to an ideal input-output characteristic of a limiter designated by a than that of the conventional simple differential amplifier designated by b.

Specifically, in the embodiments shown in FIGS. 3, 14, 16, 17, 19 and 20, it is possible to obtain output suitably given amplitude limiting from the output terminals 3 and 4 by realizing the load 15 by a suitable circuit as shown in FIGS. 4A to 4C and inputting signals from the input terminals 1 and 2.

(2) Embodiment as a Multiplier

The linear operation range of the linearized differential amplifier of the present invention is markedly wide as compared to the conventional differential pair, but is narrow to the Gilbert's gain cell. However, though the Gilbert's gain cell requires a lowest operation voltage of at least 2 V, the linearized differential amplifier according to this invention can be operated even at about 1 V. Thus, it is possible to realize a circuit operable at a relatively low voltage, which is impossible by the prior art.

Figure 23:
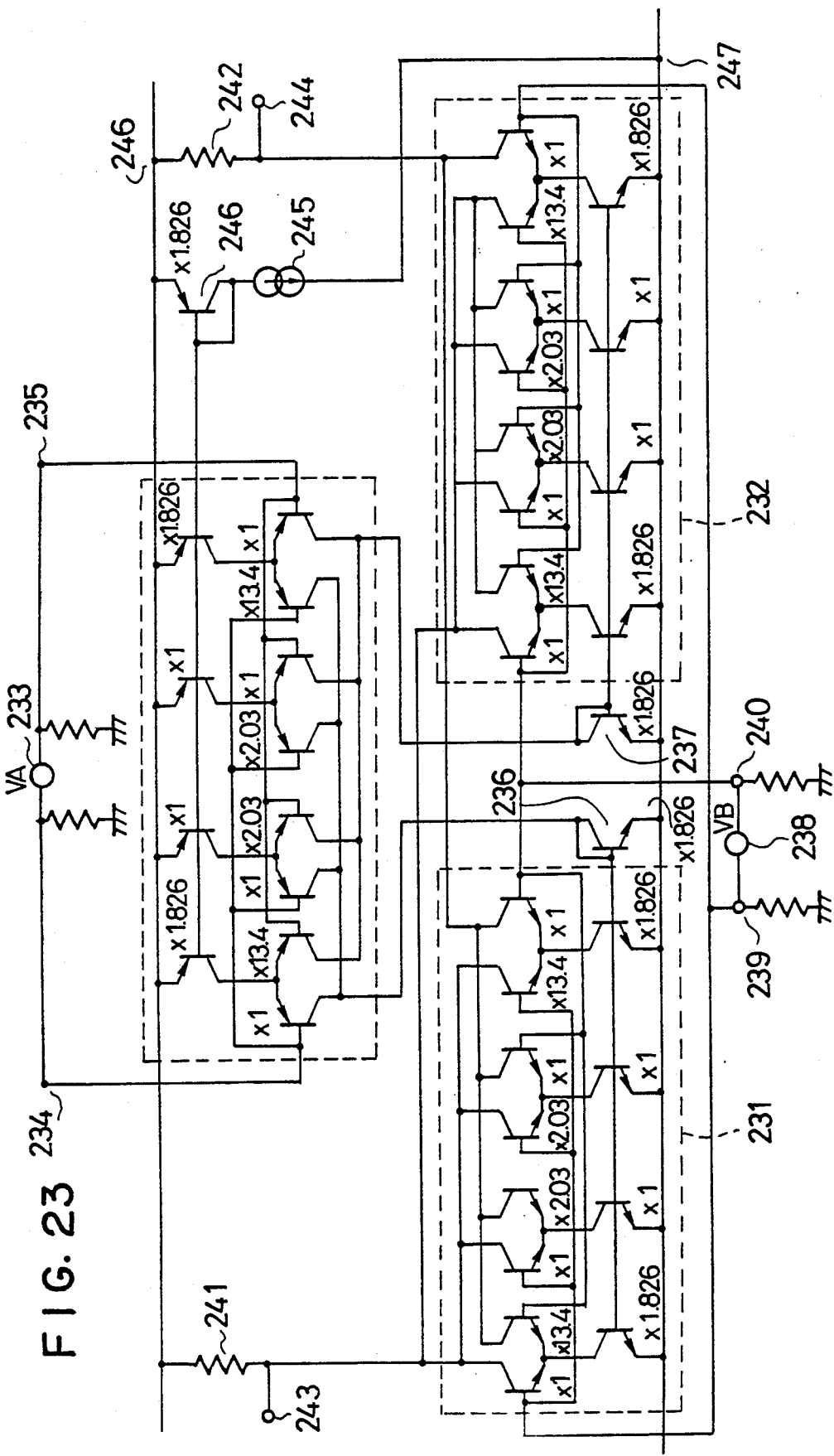
FIG. 23 is a circuit diagram of an analog multiplier related to the present invention.

Next, an embodiment of an analog multiplier is explained. FIG. 23 shows a circuit diagram of an analog multiplier related to the present invention. In the same drawing, reference numerals 230, 231, and 232 respectively show the linearized differential amplifier according to this invention, for example, the one described in FIG. 9. Moreover, it should be also possible to use the other embodiments of the present invention (for example, the one in FIG. 11) for these parts. Of these linearized differential amplifiers 230, 231, 232 in FIG. 23, the one designated by 230 is composed of transistors respectively having reverse polarity to those in the other two. This is not an essential condition, but is important in simplification of the circuit composition. Thus, the explanation on this point is given in more detail.

A differential voltage signal applied to first input terminals 234 and 235 from a first input signal source 233 generates a differential output current by the transconductance of the second linearized differential amplifier 230. Then, the differential output current is arranged by transistors 236 and 237 provided by diode connection so that the resultant operational currents for the differential amplifiers 231 and 232 are in proportion to the differential output current.

While, the first and second linearized differential amplifiers 231 and 232 are connected to each other so that a signal outputted from a second input signals source 238 is inputted into second input terminals 239 and 240 with reverse phases respectively, and output currents from the amplifiers 231 and 232 are added to each other. Then, the output finally obtained by converting the output currents from the first and second linearized differential amplifiers by load resistances 241 and 242 is outputted to output terminals 243 and 244.

When the differential input voltage of first signal source is 0, since the operational currents of the first and second linearized differential amplifiers are equal, changes of the output currents from the first and second linearized differential amplifiers cancel each other irrespectively of the differential input voltage from the second signal source so that the output current obtained by addition of these is not changed. As the result, the potential difference between the output terminals 243 and 244 becomes 0. However, when the differential input voltage of the first signal source is not 0, the operational voltages of the first and second linearized differential amplifiers change with reverse polarities to each other in proportion to the first input. Thus, the differential output voltage between the output terminals 243 and 244 is in proportion to the differential input voltage of the second signal source except in the case where the differential input voltage of the second signal source is not 0. At the time, the proportionality factor depends on the transconductances of the first and second linearized differential amplifiers, and is in proportion to the operational currents. Thus, it is in proportion to the first input. Accordingly, the differential output voltages obtained at the output terminals 243, 244 are respectively in proportion to the differential input voltages of the first and second signals sources. As a result, the function required as a multiplier can be obtained. Moreover, since the circuit has a symmetric composition, it is clearly understood that the final differential output voltage becomes 0 when the second differential input signal is 0. Thus, according to the circuit construction as shown in FIG. 23, an analog multiplier of the four quadrant type can be realized.

Figure 24:
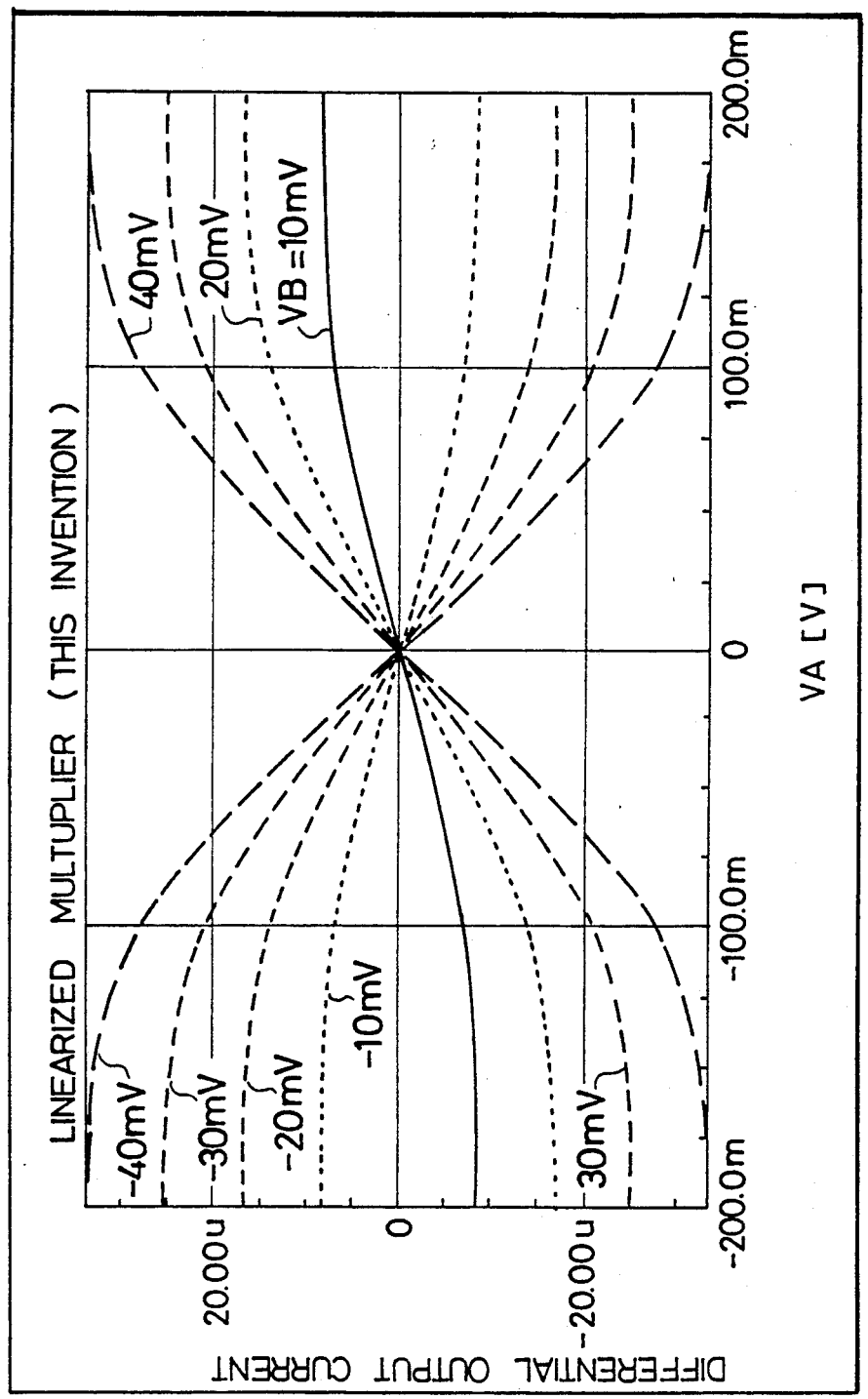
FIG. 24 shows a result obtained by simulation of a input-output characteristics.

FIG. 24 shows a result obtained by simulation of the input-output characteristics when a current of a current source 245 is 10 $\mu$A, and a positive power source terminal 246 and a negative power source terminal 247 are respectively applied with voltages of $\pm 0.75$ V in the circuit of FIG. 23. In the same drawing, the lateral axis shows the differential input voltage of the first signal source, and the vertical axis shows the difference of currents at loads 241 and 242 and the differential input voltages of the second signal source in a range of $-40$ mV to 40 mV at an interval of 10 mV are used as parameters. From the same drawing, it is seen that there are ranges of linear operations of several tens of mV on either of the first and second input. This circuit corresponds to the one modified and shown in FIG. 9.4 of § 9.4, pp. 456-459 in "Bipolar and MOS Analog Integrated Circuit Design", but as described in the same literature, the linear operation range of conventional differential pairs is several mV or less. Accordingly, it is possible to enlarge the linear operation range ten times or more at a relatively low voltage by using the linearized differential amplifier of the present invention.

Figure 29:
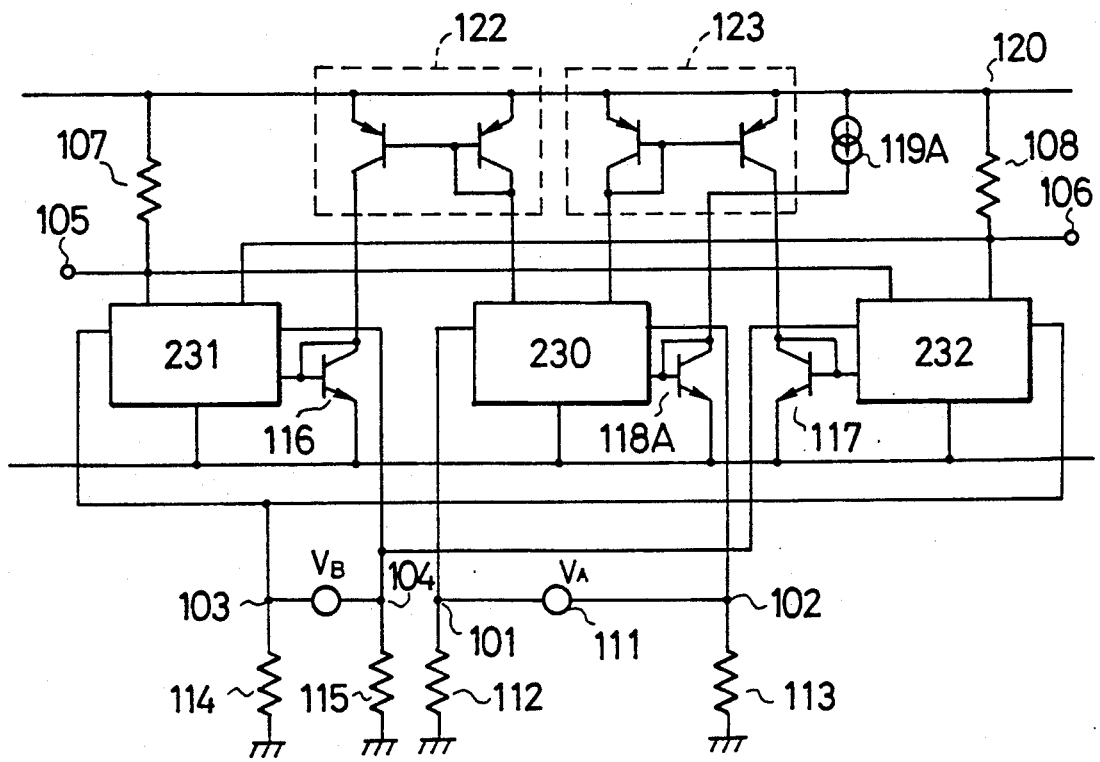
FIG. 29 is a circuit diagram having linearized amplifiers which are composed of NPN transistors only.

In this embodiment, though the first and third differential amplifiers are composed of NPN transistors, and the first is composed of PNP transistors, it is possible to compose all the three with NPN transistors as shown in FIG. 29 so that an output current of the central one is repeated at current mirror circuits 122 and 123 to obtain the same operation as shown in FIG. 23. However, since the central linearized differential amplifier is composed of NPN transistors, it is necessary to change the transistor and the current source 118 and 245 for setting bias into those 118A and 119A of the reverse polarity.

Moreover, it is clear that the differential amplifier having the conventional emitter degeneration register can be used in the central linearized differential amplifier 230 alone in the FIGS. 23 and 29.

(3) Embodiment as a Filter

Figure 27:
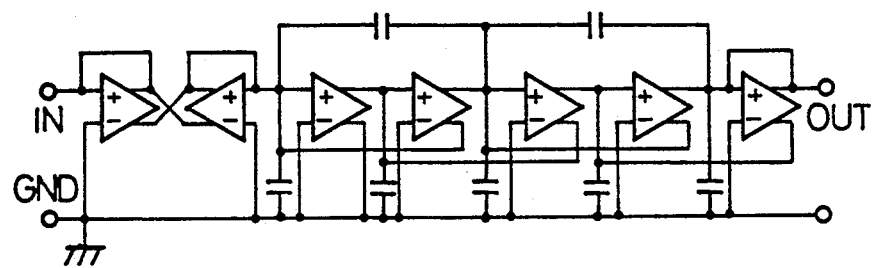
FIG. 27 is a circuit diagram of the active filter in the differential amplifier used in the measurements as shown in FIG. 25.

The linearized differential amplifier of the present invention can be also used as a variable transconductor. Accordingly, as shown in FIGS. 3 and 4 in D. W. H. Calder; "Audio Frequency Gyrator Filters for an Integrated Radio Paging Receiver", International Conference on Mobile Radio Techniques, IEEE Conference, York, England, pp. 21-26, 1984, it is possible to compose a gyrator using two transconductors to make an equivalent inductor using the gyrator and a capacitor. Thus, it is also possible to realize an active filter based on an integrated circuit which is composed of the transconductor and capacitor finally. FIG. 27 is a circuit diagram of a low-pass filter of the fifth order designed by the method described in the same literature. In the same drawing, each of triangle symbols shows a transconductor, and specifically, the linearized differential amplifier of the present invention (in this case, N=4) is used as the transconductor. In the same literature, since a conventional linearized differential amplifier in case of N=2 is used, this embodiment can guarantee the linear operation range two times or more as wide as the conventional one. Actually, since the linearized differential amplifier has an offset voltage of about several millivolts to 10 mV, the linear operation range becomes narrow. Though the conventional linearized differential amplifier has a linear operation range of only about 30 mV, the range of the linearized differential amplifier according to the present invention is about 100 mV.

Figure 25:
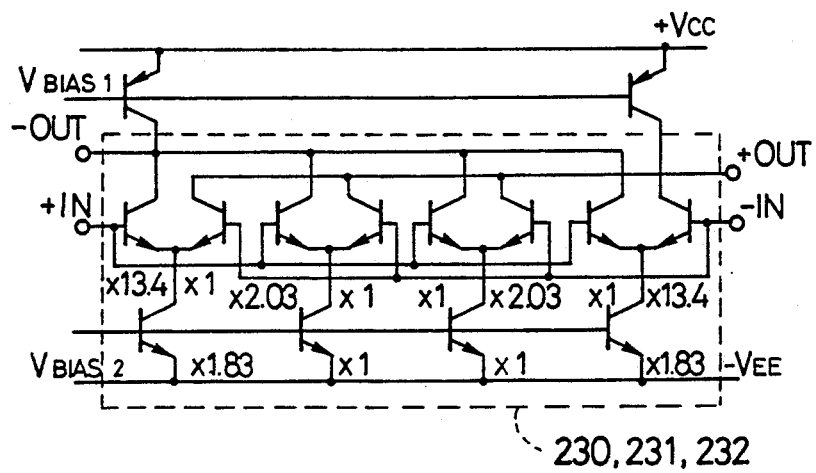
FIG. 25 is a circuit diagram of a linearized differential amplifier (N=4) according to the invention.
Figure 26:
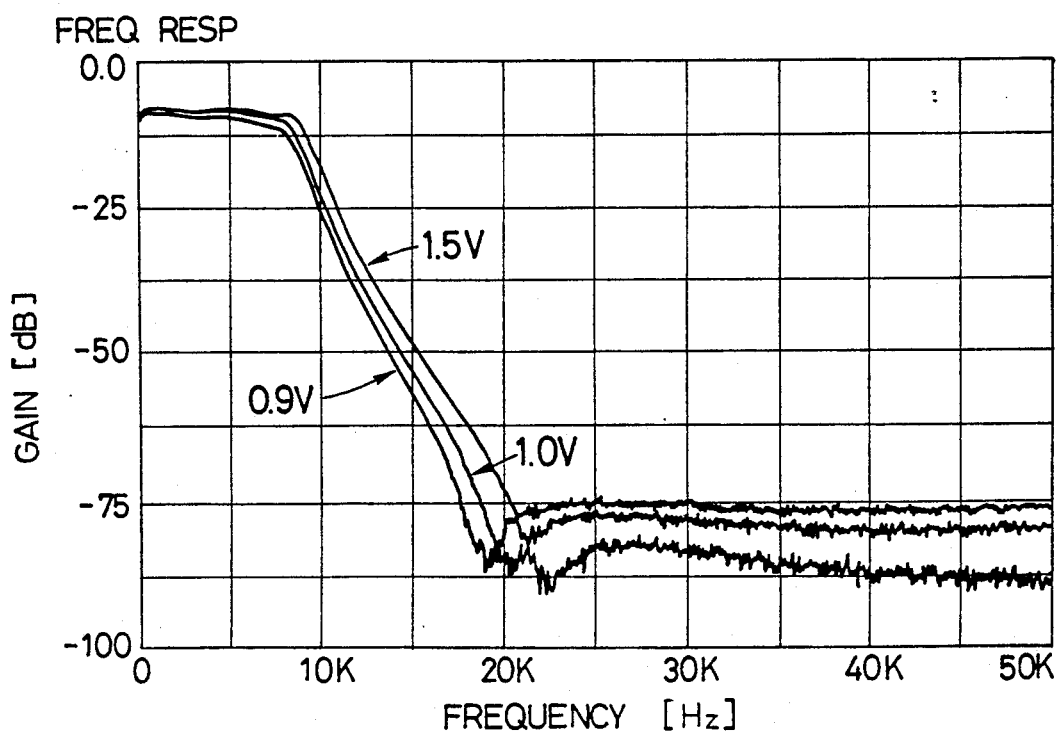
FIG. 26 shows measurement results on the frequency characteristic of an active filter of the linearized differential amplifier as shown in FIG. 25.
Figure 28:
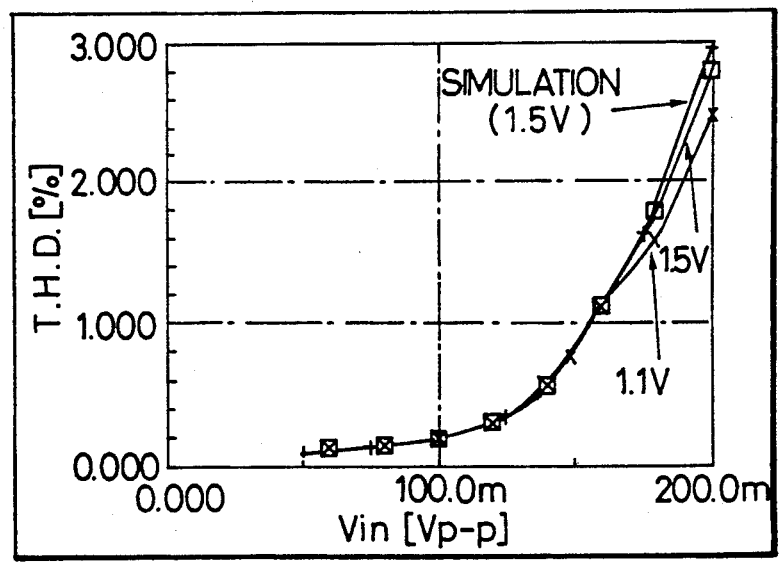
FIG. 28 shows measurement results on the distortion factor characteristic at 1 kHz of the active filter as shown in FIG. 27.

FIG. 26 shows measurement results on the frequency characteristic of an active filter based on the circuit of FIG. 27 to which is applied a linearized differential amplifier of FIG. 25 related to this invention. In the same diagram, the input voltage is measured under the condition of 100 mVp-p using the power source voltage as a parameter, and it is seen that preferred characteristics can be obtained down to about 1 V. Moreover, FIG. 28 shows measurement results on the distortion factor characteristic at 1 kHz of the active filter prepared. Comparing the characteristics when the distortion factor is 1%, input of about 150 mVp-p is possible in either case of the power source voltage of 1.1 V and 1.5 V. As stated above, it is proved that the present invention is suitable for the low voltage operation.

In the above described embodiments, the weighting means for current comprise current sources of transistors connected to the common emitters of the differential pairs. And the operational current of the differential pairs given by the weighting means are disclosed for fixed and variable cases.

The transconductance of the linearized differential amplifier according to the invention is given by the sum of the transconductance of each of the differential pairs which form the entire linearized differential amplifier. Accordingly, the total transconductance is proportional to absolute temperature T as is evident by equation (2).

When the absolute value of transconductances is an important factor for the application of the differential amplifier, in some case, a wrong operation is caused by a change of its transconductance value according to a change of absolute temperature T.

In the following embodiment, a method by which transconductance of the linearized differential amplifier according to the invention is not changed by a change of temperature will be explained. As a basic idea, it can be understood by equation (2); namely, the fact that the total transconductance is proportional to the $I_{EE} \cdot q/kT$ is utilized. In other words, the total transconductance can be kept at a constant value by making the operational current $I_{EE}$ proportional to an absolute temperature T.

Figure 30:
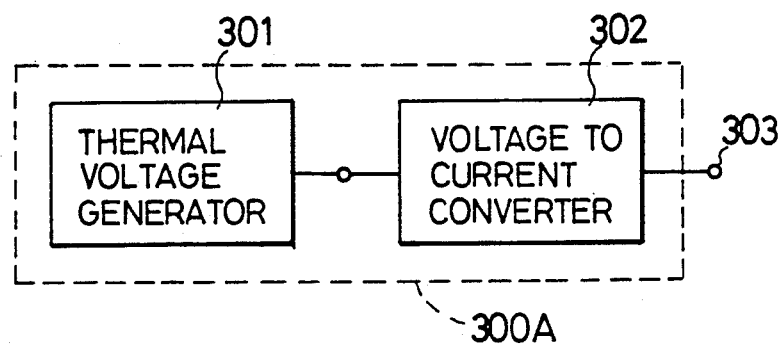
FIG. 30 shows an inside compositional diagram of the operational current generating circuit.

FIG. 30 shows an inside compositional diagram of the operational current generating means 9 as shown in FIG. 3 according to the embodiment. The operational current generating means 300A comprises the thermal voltage generating means 301 and a voltage to current converter 302 as a voltage to current converting means. A reference number 303 indicates a current output terminal.

In a semiconductor device, a voltage which is in proportion to the thermal voltage $kT/q$ can be easily generated, which is proportional to an absolute temperature T. As a basis to generate currents proportional to an absolute temperature T, the thermal voltage generating means 301 is used. Thereby an output of the thermal voltage generating means 301 is inputted into the voltage to current convertor 302. Finally, a current in proportion to an absolute temperature T can be outputted from the current output terminal 303. Namely, the output current of the current output terminal 303 is proportional to an absolute temperature T. In this case, a voltage-to-current conversion coefficient of the voltage to current converter 302 must be independent of temperature. A factor having a physical dimension of a conductance—i.e. reciprocal of a resistance—is required for conversion from a voltage to a current. Furthermore, the factor should not be changed by a temperature. Registors which can be used in an ordinary integrated circuit (IC) technology have rather poor reproducibility and their values statistically changes about 30% around their nominal values. In addition, their temperature coefficient ranges from about 500 ppm/degree to 3000 ppm/degree. It, therefore, is difficult to reduce the temperature coefficient of the transconductance of the linearized differential amplifier using the registor within the IC.

Accordingly, a registor having smaller temperature coefficient may be installed external to the IC to compensate for the temperature dependence of the transconductance of the differential amplifier. As the registor is required at lease only one for all the differential amplifiers in the same IC as described below, it can be manufactured at relatively low cost.

Figure 31A:
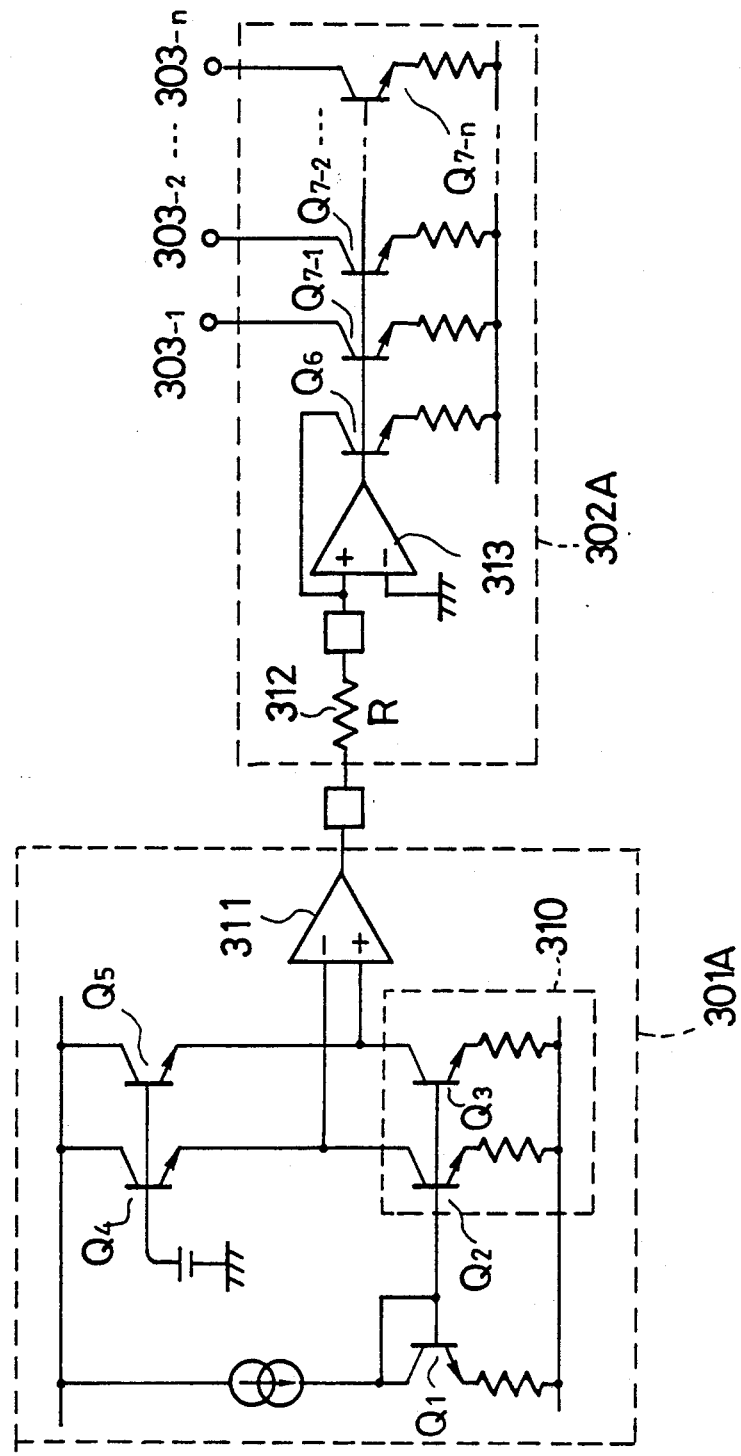
FIG. 31A is a compositional diagram of the operational current generation means.

FIG. 31A is a compositional diagram of the operational current generation means 300A as a specific embodiment.

In the same diagram, $Q_1$, $Q_2$, and $Q_3$ are transistors which constitute current sources 310, $Q_4$ and $Q_5$ are transistors whose emitter areas have a ratio of 1:N. 311 is a differential amplifier. Moreover, in the voltage to current converter 302A, 312 is an external registor, 313 is a differential amplifier, $Q_6$, and $Q_{7\text{-}1}$ to $Q_{7\text{-}n}$ are transistors which constitute the current source, and $303_{\text{-}1}$, $303_{\text{-}2}$ to $303_{\text{-}n}$ are current output terminals.

In the current generation means 300A as above described composition, if the equal currents are flowed in the transistor $Q_4$ and $Q_5$ by a function of the current source 310, as the ratio of the emitter areas of the transistor $Q_4$ and $Q_5$ is 1:N, the base-emitter voltage of $Q_4$ and $Q_5$ (denote $V_{BE4}$ and $V_{BE5}$, respectively) will become the following equations (49).

$$V_{BE4} = V_T \cdot \log_e(I_o/I_s) \quad (49)$$

$$V_{BE5} = V_T \cdot \log_e(I_o/(N \cdot I_s))$$

where $V_T$ is a thermal voltage, $I_o$ is a collector current of the transistor $Q_4$ and $Q_5$, and $I_s$ is a saturation current of the transistor $Q_4$.

As shown in the same diagram, a difference between emitter voltages becomes the following value because the base voltage of the transistor $Q_4$ and $Q_5$ is equal.

$$(kT/q) \cdot \log_e(N).$$

A voltage proportional to the difference of the emitter voltage, therefore is outputted from the differential amplifier 311.

Briefly, a differential gain of the differential amplifier 311 is assumed to be 1 then, an output voltage proportional to change of a temperature is outputted, as the N and q are independent of the temperature.

A terminal voltage of a noninverting terminal (+) is a virtual ground voltage, in the voltage to current converting means 302A. Accordingly, the output voltage of the differential amplifier 311 is directly applied to the register 312. When a value of the register 312 is R, a current obtained by the following value flows in the register 312:

$$(V_T/R) \cdot \log_e(N).$$

As the current is equal to the collecter current of the transistor $Q_6$, a current proportional to this current of the value $[(V_T/R) \cdot \log_e(N)]$, therefore flows in the transistors $Q_7$ and $Q_8$ and thereby a current proportional to an absolute temperature T is outputted from the voltage to current converting means 302A.

As described above, it is clear that the current generating means proportional to an absolute temperature T is realized by using the registor having sufficiently small temperature coefficient.

Figure 31B:
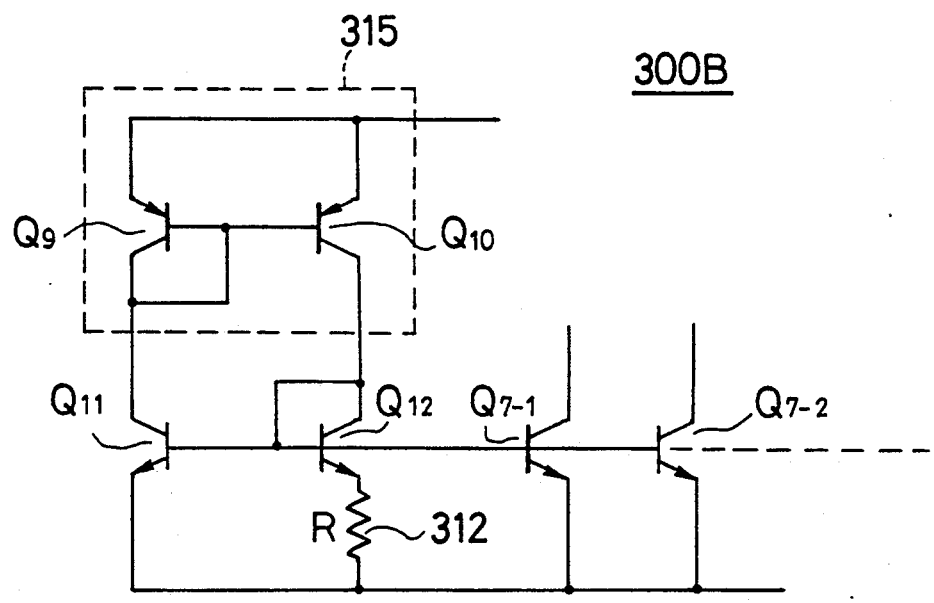
FIG. 31B is a compositional diagram of an operational current generation means.

FIG. 31B is a compositional diagram of an operational current generating means 300B as another specific embodiment.

A thermal voltage generating means and a voltage to current converting means are merged in the current generation means 300B.

In the FIG. 31B, $Q_9$ and $Q_{10}$ are transistors which constitute a current mirror circuit 315. And $Q_{11}$ and $Q_{12}$ are transistors which have a ratio of emitter areas of 1:N. In the current generating means, the collector currents of the transistors $Q_{11}$ and $Q_{12}$ are kept equal to each other. Thereby, a differential voltage between a base-emitter voltages of the transistors $Q_{11}$ and $Q_{12}$ appear across the register 312 having a value R connected to the emitter side of the transistor $Q_{12}$. The voltage is equal to the value $[(V_T/R) \cdot \log_e(N)]$ as above described. Accordingly, a current which flows in the register 312 is given by the following value:

$$(V_T/R) \cdot \log_e(N).$$

This current value equals to the collector current values of the transistor $Q_{11}$ and $Q_{12}$. As a base voltage of the transistor $Q_{7-1}$ and $Q_{7-2}$ are the same as that of the transistor $Q_{11}$, a current propotional to an absolute temperature T flows in the collector of the transistors $Q_{7-1}$ and $Q_{7-2}$. In this case, a registor having a sufficiently small temperature coefficient is used.

Figure 32:
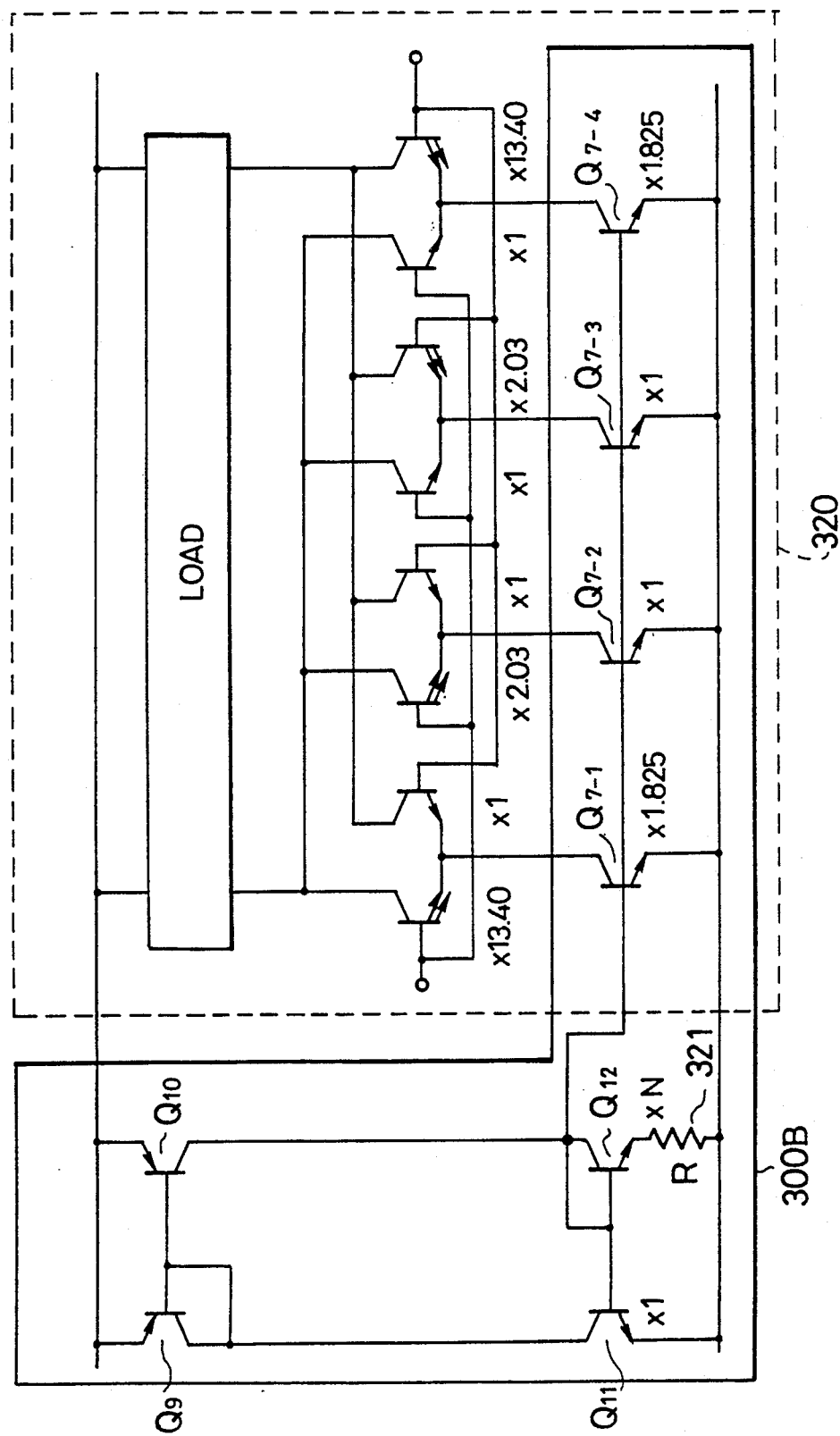
FIG. 32 shows a specific compositional diagram of an integrating circuit.

FIG. 32 shows a specific compositional diagram of an amplifier circuit as an application of the linearized differential amplifier according to the invention.

This circuit comprises a combination of the current generating means 300B as shown in FIG. 31B and the differential amplifier circuit as shown in FIG. 17. In FIG. 32, 320 is a differential amplifier circuit obtained by the group of the current sources 109A to 109D as shown in FIG. 17 realized by transistors $Q_{7-1}$ to $Q_{7-4}$.

A ratio of these emitter areas is set in about 1.825:1:1:1.825(=1:0.548:0.548:1). Thereby, the maximum flat feature of the transconductance of the differential amplifier 320 can be obtained. In the linearized differential amplifier 320 as above described, the registor 321 only having a smaller temperature coefficient is installed and thereby a suitable temperature compensation is realized in it.

Moreover, in the embodiment of the differential amplifier as shown in FIG. 19 (or FIG. 20), when the circuits as shown in FIGS. 31A and 31B instead of the current sources 109A to 109D and transistors 1033 to 1035 (or 1044 to 1046) which constitute them are used, the transconductance of the differential amplifier can have a constant value in spite of change in temperature.

Various modification will become possible for skilled in the art after receiving the teachings of the present disclosure without departing from the scope thereof.

What is claimed is:

1. A linearized differential amplifier, comprising:
   differential pairs of N (N is an integer of at least three) sets arranged in parallel and each comprising bipolar transistors,
   means for supplying an equivalent offset voltage to each differential pair;
   means for weighting output currents provided from each differential pair; and
   means for adding the output current provided from each differential pair,
   wherein equivalent offset voltages provided to each differential pair are different from each other.

2. A linearized differential amplifier according to claim 1, wherein
   the means for supplying offset voltages and the means for weighting the output currents respectively carry out equivalent weighting of the offset voltages and the output currents so that a change of the output current provided from each differential pair corresponding to a change of an input voltage inputted to the linearized amplifier exhibits a flat characteristic.

3. A linearized differential amplifier according to claim 2, wherein
   the output currents to be weighted by the means for weighting have current values of current sources connected to respective emitters commonly connected in the N sets of differential paris.

4. A linearized differential amplifier according to claim 3, wherein
   the number of the N sets of differential pairs is four, and the equivalent offset voltages to be provided to the four sets of differential pairs are respectively near to:
   $1.298 \cdot 2 \cdot V_T$ for the first differential pair;
   $0.354 \cdot 2 \cdot V_T$ for the second differential pair;
   $-0.354 \cdot 2 \cdot V_T$ for the third differential pair; and
   $-1.298 \cdot 2 \cdot V_T$ for the fourth differential pair (where $V_T$ is the thermal voltage expressed by the equation: $V_T = kT/q$, k = Boltzmann's constant, T = absolute temperature, q = electric charge of an electron), and the ratio of weighting the output currents of the first to the fourth differential pair is about 1:0.5478:0.5478:1.

5. A linearized differential amplifier according to claim 1, wherein the means for supplying offset voltages and the means for weighting the output currents respectively carry out equivalent weighting of the offset voltages and the output currents so that a change of the output current provided from each differential pair corresponding to a change of a differential input voltage inputted to the linearized amplifier exhibits equal ripple characteristic.

6. A linearized differential amplifier according to claim 5, wherein the output currents to be weighted by the means for weighting have current values of current sources connected to respective emitters commonly connected in the N sets of differential pairs.

7. A linearized differential amplifier according to claim 1, wherein the means for supplying different and equivalent offset voltages is effected by selecting emitter areas of transistors which are compositional elements of each differential pair.

8. A linearized differential amplifier according to claim 7, wherein the number of differential pairs of the N sets is four, and a ratio of the emitter areas of the transistors which make up the differential pairs of the four sets is 1:13.40261, 1:2.030215, 2.030215, and 13.40261:1, respectively.

9. A linearized differential amplifier according to claim 1, wherein the means for adding the output currents of the differential amplifire pairs is composed of a wired OR by which the output terminals of the differential pairs are connected to each other.

10. A linearized differential amplifier according to claim 1, wherein the means for weighting the output currents is effected by a changeable transconductance of each differential pair obtained by changing proportionally the operational currents of all of the differential pairs.

11. A linearized differential amplifier according to claim 1, wherein the bipolar transistors are composed of silicon transistor.

12. A linearized differential amplifier according to claim 1, wherein the bipolar transistors are composed of silicon heterobipolar transistor.

13. A linearized differential amplifier according to claim 1, wherein the bipolar transistors are composed of Gallium-Arsenide-heterobipolar transistor.

14. A linearized differential amplifier according to claim 1, wherein the means for weighting is effected by changing the operational currents of the differential pairs in proportion to the absolute temperature.

15. A linearized differential amplifier according to claim 1, wherein each differential pair has two input terminals and two output terminals, the input terminals being connected to the means for supplying the equivalent offset voltage, the output terminals being connected to the means for adding the output current, one input terminal in each differential pair being connected to one another, the other input terminal in each differential pair being connected to one another, one output terminal in each differential pair being connected to one another, and the other output terminal in each differential pair being connected to one another.

16. A linearized differential amplifier according to claim 15, wherein the means for adding the output currents of the differential pairs is composed of a wired OR by which the output terminals of the differential pairs are connected to one another.

17. A linearized differential amplifier, comprising:

differential pairs of three sets arranged in parallel and each comprising bipolar transistors, means for supplying an equivalent offset voltage to each differential pair;

means for weighting output currents provided from each differential pair; and means for adding the output currents provided from each differential pair, wherein the equivalent offset voltages are different from each other.

18. A linearized differential amplifier according to claim 17, wherein the means for supplying offset voltages and the means for weighting the output currents respectively, carry out equivalent weighting of the offset voltages and the output currents so that a change of the output current provided from each differential pair corresponding to a change of an input voltage inputted to the linearized amplifier shows a flat characteristic.

19. A linearized differential amplifier according to claim 18, wherein the output currents to be weighted by the means for weighting have current values of current sources connected to respective emitters commonly connected in the three sets of differential pairs.

20. A linearized differential amplifier according to claim 19, wherein the equivalent offset voltages to be provided to the three sets of differential pairs are respectively near to:

$1.03 \cdot 2 \cdot V_T$ for the first differential pair;

0.0 for the second differential pair; and $-1.03 \cdot 2 \cdot V_T$ for the third differential pair (where $V_T$ is the thermal voltage expressed by the equation: $V_T = kT/q$, k = Boltzmann's constant, T = absolute temperature, q = electric charge of an electron), and the ratio of weighting the output currents of the first and the third differential pair to the second differential pair is about 0.64 times.

21. A linearized differential amplifier according to claim 17, wherein the means for supplying offset voltages and the means for weighting the output currents respectively, carry out equivalent weighting of the offset voltages and the output currents so that a change of the output current corresponding to a change of a differential input voltage inputted to the linearized differential amplifier exhibits equal ripple characteristic.

22. A linearized differential amplifier according to claim 21, wherein
the output currents to be weighted by the means for weighting have current values of current sources connected to respective emitters commonly connected in the three sets of differential pairs.

23. A linearized differential amplifier according to claim 17, wherein
the means for supplying different and equivalent offset voltages is effected by selecting emitter areas of transistors which are compositional elements of each differential pair.

24. A linearized differential amplifier according to claim 23, wherein
ratio of the emitter areas of the transistors which make up the differential pairs of the three sets is 1:7.872983, and 1:1, and 7.872983:1, respectively.

25. A linearized differential amplifier according to claim 17, wherein
the means for adding the output currents of the differential pairs is composed of a wired OR by which the output terminals of the differential pairs are connected to each other.

26. A linearized differential amplifier according to claim 17, wherein
the means for weighting the output currents is effected by a changeable transconductance of each differential pair obtained by changing proportionally the operational currents of all of the differential pairs.

27. A linearized differential amplifier according to claim 17, wherein
the bipolar transistors are composed of silicon transistor.

28. A linearized differential amplifier according to claim 17, wherein
the bipolar transistors are composed of silicon-heterobipolar transistor.

29. A linearized differential amplifier according to claim 17, wherein
the bipolar transistors are composed of Gallium-Arsenide-heterobipolar transistor.

30. A linearized differential amplifier according to claim 17, wherein the means for weighting is effected by changing the operational currents of the differential pairs proportional to the absolute temperature.

31. A linearized differential amplifier according to claim 17, wherein
each differential pair has two input terminals and two output terminals,
the input terminals being connected to the means for supplying the equivalent offset voltage,
the output terminals being connected to the means for adding the output current,
one input terminal in each differential pair being connected to one another,
the other input terminal in each differential pair being connected to one another,
one output terminal in each differential pair being connected to one another, and
the other output terminal in each differential pair being connected to one another.

32. A linearized differential amplifier according to claim 31, wherein
the means for adding the output currents of the differential pairs is composed of a wired OR by which the output terminals of the differential pairs are connected to one another.

* * * * *